US009082867B2

(12) United States Patent
Roizin et al.

(10) Patent No.: US 9,082,867 B2
(45) Date of Patent: Jul. 14, 2015

(54) EMBEDDED COST-EFFICIENT SONOS NON-VOLATILE MEMORY

(71) Applicant: Tower Semiconductor Ltd., Migdal Haemek (IL)

(72) Inventors: Yakov Roizin, Afula (IL); Evgeny Pikhay, Haifa (IL); Vladislav Dayan, Nazareth Illit (IL); Micha Gutman, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 170 days.

(21) Appl. No.: 13/756,481

(22) Filed: Jan. 31, 2013

(65) Prior Publication Data

US 2014/0209994 A1 Jul. 31, 2014

(51) Int. Cl.
*H01L 29/792* (2006.01)
*H01L 21/28* (2006.01)
*H01L 27/115* (2006.01)
*H01L 29/66* (2006.01)

(52) U.S. Cl.
CPC ........ *H01L 29/792* (2013.01); *H01L 21/28282* (2013.01); *H01L 27/11573* (2013.01); *H01L 29/66833* (2013.01)

(58) Field of Classification Search
CPC ............... H01L 27/115; H01L 29/792; H01L 21/28282; H01L 29/7923; H01L 29/66833; H01L 29/7885; H01L 29/4234; H01L 29/518; H01L 29/7881; H01L 27/11568
USPC ................................................ 257/324, 408
See application file for complete search history.

(56) References Cited

U.S. PATENT DOCUMENTS

| 5,768,192 | A | 6/1998 | Eitan |
| 6,765,259 | B2 | 7/2004 | Kim |
| 7,482,233 | B2 | 1/2009 | Roizin et al. |
| 7,859,043 | B2 | 12/2010 | Pikhay et al. |
| 8,043,923 | B2 | 10/2011 | Kim et al. |
| 2007/0133307 | A1 | 6/2007 | Hsu et al. |
| 2008/0175049 | A1* | 7/2008 | Lin .......................... 365/185.05 |

OTHER PUBLICATIONS

Liu, Zhizheng, et al.: "A new programming technique for flash memory devices", International Symposium on VLSI Technology, Systems and Applications, 1999, pp. 195-198.

* cited by examiner

*Primary Examiner* — Whitney T Moore
(74) *Attorney, Agent, or Firm* — Bever, Hoffman & Harms, LLP

(57) ABSTRACT

A cost-efficient SONOS (CEONOS) non-volatile memory (NVM) cell for use in a CMOS IC, where the CEONOS NVM cell requires two or three additional masks, but is otherwise substantially formed using the same standard CMOS flow processes used to form NMOS transistors. The cell is similar to an NMOS cell but includes an oxide-nitride-oxide (ONO) layer that replaces the standard NMOS gate oxide and serves to store NVM data. The cells utilize special source/drain engineering to include pocket implants and lightly-doped drain extensions, which facilitate program/erase of the CEONOS NVM cells using low voltages (e.g., 5V). The polysilicon gate, source/drain contacts and metallization are formed using corresponding NMOS processes. The CEONOS NVM cells are arranged in a space-efficient X-array pattern such that each group of four cells share a drain diffusion and three bit lines. Programming involves standard CHE injection or pulse agitated interface substrate hot electron injection (PAISHEI).

9 Claims, 16 Drawing Sheets

EMBEDDED COST-EFFICIENT SONOS NON-VOLATILE MEMORY

FIELD OF THE INVENTION

The present invention relates to non-volatile memory (NVM) cells. More specifically, the present invention relates to many-times programmable NVM cell arrays that are "embedded" in (i.e., integrally formed with) complementary metal-oxide-semiconductor (CMOS) integrated circuits (ICs), and to methods for fabricating the NVM cells that require minimal changes to standard CMOS process flows.

BACKGROUND OF THE INVENTION

"CMOS" refers to both a particular style of digital circuitry design, and the family of processes used to implement that circuitry on IC "chips" or "die". CMOS logic uses a combination of p-type and n-type metal-oxide-semiconductor field-effect transistors (MOSFETs) to implement logic gates and other digital circuits found in computers, telecommunication equipment, and signal processing equipment. Typical commercial CMOS ICs include millions (or hundreds of millions) of n-type and p-type MOSFETS.

Most CMOS IC manufacturers (aka, "fabs") generate standardized process "flows" for generating CMOS ICs on monocrystalline silicon wafers. Each CMOS process flow includes a series of processing steps (e.g., material deposition, photolithographic exposure, and etching) that are required to produce a desired CMOS IC product. Standard CMOS process flows are typically developed to produce "normal" CMOS IC devices (i.e., CMOS IC devices that comprise mainly volatile n-type and p-type MOSFETS) using a minimum number of processing steps in order to minimize overall production costs. Significant effort is typically expended by each manufacturer to make their standard CMOS process flow as time and cost efficient as possible. Once a standard CMOS flow is optimized, it can typically be used to make a large number of CMOS IC designs merely by providing a different set of photolithography masks for each IC design, and then repeating the standard CMOS process flow using the selected set of photolithography masks.

Although most standard CMOS process flows facilitate the inclusion of non-MOSFET circuit components into the CMOS IC products, a problem arises when a circuit design requires a component that cannot be produced by the standard CMOS process flow. In this case, the CMOS process flow must be modified at great expense to include additional steps in order to produce the needed circuit component. It is therefore desirable to develop methods for producing the non-standard circuit component using the steps of the existing CMOS process flow. When this goal is not possible, it is desirable to develop methods for non-standard circuit components that minimize the number of changes to the existing CMOS process flow.

Non-volatile memory (NVM) or "floating gate" cells represent one type of non-standard circuit component that is often needed in large scale CMOS ICs. In contrast to volatile (aka primary storage) memory such as SRAM based on typical n-type and p-type MOSFETs, which require continuous power to retain stored information, NVM cells are able to retain a stored state even when power to an IC is turned off, thereby allowing the IC to "remember" important operating conditions and information upon restart. Several types of NVM cells have been developed that can be produced with minimal changes to a standard CMOS process flow.

There is a currently a need for low cost, small size, many-times programmable (MTP) NVM cells that can be implemented using standard CMOS processes (or with minimal changes). That is, there are small, low-cost one-time-programmable (OTP) memories in the range of one to a few Mbits that can be fabricated with no additional masks to a standard CMOS process (e.g., antifuse memories produced by Kilopass Technology Inc. of Santa Clara, Calif., USA, and Sidense Corp. of Ottawa, Ontario, Canada). However, these OTP memories are not favored in the market because they cannot be re-programmed to implement code changes that are often needed to achieve minimal "time-to-market" for numerous designs employing NVM cells to control IC operations. Conversely, MTP and few-times-programmable (FTP) embedded NVM arrays are available, but existing FTP and MTP solutions are problematic for reasons detailed below, but in general because such MTP and FTP NVM cells require a large deviation from standard CMOS process flows, or have a cell size that is too large (i.e., providing FTP or MTP NVM arrays having a density ranging from 0.5 Mbit to 2 Mbit is proving to be a challenge to the semiconductor industry).

One type of MTP embedded NVM cell is the NROM memory cell based on charge trapping in ONO stack is disclosed in U.S. Pat. No. 5,768,192 (Saifun Semiconductor, Tower Semiconductor trademark: MicroFlash®). A problem with this approach is that these cells require a complex manufacturing process with N+ drain and source bit lines different from diffusions of n-channel MOS transistor. Special high voltage circuitry is also needed to provide voltages of the order of 8-9V for NROM programming and erase. These differences require 11-12 additional masks to the core CMOS process flow, thus making this technology expensive to implement.

Another type of MTP embedded NVM cell uses an H-array architecture that employs a CMOS-type transistor with an ONO dielectric (see, e.g., U.S. Pat. No. 6,765,259). This type of NVM cell architecture provides excellent area utilization, but requires special high voltage circuits to perform program and erase operations. That is, standard CMOS devices does not support the high program/erase voltages required by these cells, and therefore additional masks and processing steps are needed to provide suitable devices. This H-array architecture can also suffer from disturbs during programming and read of the multiple cells that share the same drain contact in the word-line direction. These disturbs can be inhibited, but this requires additional complicated circuit design to provide inhibition voltages to the neighbor cells in the array.

What is needed is an embedded MTP NVM cell that is small in size (i.e., high density), immune to disturbs, can be produced using a standard CMOS process flow having a single polysilicon layer with a minimal number of additional masks, and exhibits high endurance.

SUMMARY OF THE INVENTION

The present invention is directed to a high-density, embedded, many-times programmable (MTP), Cost-Efficient SONOS (herein "CEONOS") non-volatile memory (NVM) cell that can be fabricated using existing CMOS process flows that are only slightly modified (i.e., to include only a small number of additional processing steps). The CEONOS NVM cell is similar to a standard NMOS transistor in that each CEONOS NVM cell includes a polysilicon gate disposed over a channel separating n-type source and drain implant regions (diffusions). However, each CEONOS NVM cell differs from a standard NMOS transistor in that it includes an Oxide-Nitride-Oxide (ONO) stack structure disposed between the source/drain regions and the polysilicon gate (i.e., instead of a standard gate oxide layer), and wherein a portion of the nitride layer serves as an electrically isolated "floating gate" (i.e., similar to isolated polysilicon structures in conventional EEPROM cells) that can be repeatedly programmed and erased to control the cell's channel current during read operations, thereby allowing CEONOS NVM cells to store data values (logic 0 or 1). The present invention thus provides a MTP NVM cell that is high density in that each cell is about the same size (i.e., occupies substantially the same chip area) as a standard NMOS transistor. Moreover, CEONOS NVM cells require only minimal changes of the existing CMOS process flows (i.e., one mask and associated processing for forming the ONO stack, a second mask and associated implants to facilitate drain/source implants through the ONO stack, and an optional third mask utilized to form an optional sacrificial oxide after the first additional (i.e., ONO) mask is removed/stripped, and to perform an adjusted contact etch to ensure ONO penetration to reach silicon surface in drain/source regions of NVM cell. All other fabrication processes needed to form CEONOS NVM cells can be performed using the existing CMOS process (e.g., concurrently with the fabrication of NMOS transistors). Because of their small cell size, and because only minimal additional steps are needed to produce CEONOS NVM cells, the present invention provides a low-cost, high density embedded NVM solution. Other processes required to form CEONOS NVM cells are performed using the same "standard" process steps used to form NMOS (i.e., CMOS n-channel) transistors, thus excluding the influence of the embedded NVM on the "standard" CMOS process flow.

According to an embodiment of the present invention, each CEONOS NVM cell is fabricated using special source/drain engineering processes to provide an enhanced lateral field for program/erase operations that facilitates the low voltage program/erase operations. In particular, in addition to N+ source/drain implants and each of the source and drain regions includes both an n-type lightly-doped drain extension diffusion (LDD) implant comprising an n-type dopant material and a p-type pocket implants, where the cell's channel is defined between the inside boundaries of the LDD implants, and the pocket implants are formed such that portions extend from respective inside LDD boundaries into the channel region. In one embodiment the LDD implants are formed, for example, by implanting Arsenic (As) or Phosphorous (P) at 10 to 50 keV in a perpendicular direction relative to the IC substrate such that inside LDD boundaries are substantially aligned with corresponding side edges of the polysilicon gate structure. In contrast, the p-type pocket implants are formed at an angle such that the p-type dopant (e.g., B or $BF_2$ implanted at 20-120 keV) forms portions under the polysilicon gate. Both implants are performed through the ONO layer at relatively high energies, requiring an additional mask that protects the "standard" CMOS circuitry during the source/drain engineering process. By fabricating the source and drain regions in this manner, the electrical field is enhanced at a point below a side edge of the polysilicon gate structure, where the vertical field has its highest values, thus facilitating desirable hot electron programming of the nitride layer such that a charge is trapped in a portion of the nitride layer (of the ONO stack) that is located above the channel region. The stored data bit (i.e., the trapped charge or absence thereof) can be subsequently read from each CEONOS NVM cell by applying suitable gate, drain and source voltages, and reading the resulting drain current. In a presently preferred embodiment, low voltage program operation are performed using a Pulse Agitated Interface Substrate Hot Electron Injection (PAISHEI) programming technique in which negative programming (voltage) pulses are applied to the drain region followed by positive pulses, and positive programming pulses are applied to the gate, so that both drain and gate positive pulses are synchronized (the source region is allowed to float). The combined drain engineering and PAISHEI programming approach facilitates programming at low voltages (e.g., 5V) by enhancing both the vertical and lateral components of the electric field after electron injection into the substrate from the drain region. That is, the electrons are heated by two mechanisms: by the vertical field generated by the gate voltage, and by the lateral field generated at drain/bulk junction regions when the electrons are moving in the channel. This programming approach is more efficient than electron heating by only using a lateral field or only using a vertical field, with the main advantage being that lower voltages can be used of programming the CEONOS NVM cells to a given threshold voltage Vt for a given time.

In accordance with another embodiment of the present invention, the CEONOS NVM cells are arranged in space-efficient X-array structures that facilitate cell operations while minimizing disturb effects. In an exemplary embodiment, groups of four CEONOS NVM cells share a single drain diffusion.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in embedded CMOS NVM cells, and is particularly directed to small-sized, Cost-Efficient SONOS (herein "CEONOS") NVM (logic) cells. The following description is presented to enable one of ordinary skill in the art to make and use the invention as provided in the context of a particular application and its requirements. The term "connected" is used to describe a direct connection between two circuit elements or structures, for example, by way of a conducting diffusion or metal line formed in accordance with normal integrated circuit fabrication techniques. In addition, the term "region" is defined herein to describe a volumetric (three-dimensional) area having substantially identical electrical properties and/or doping concentrations. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
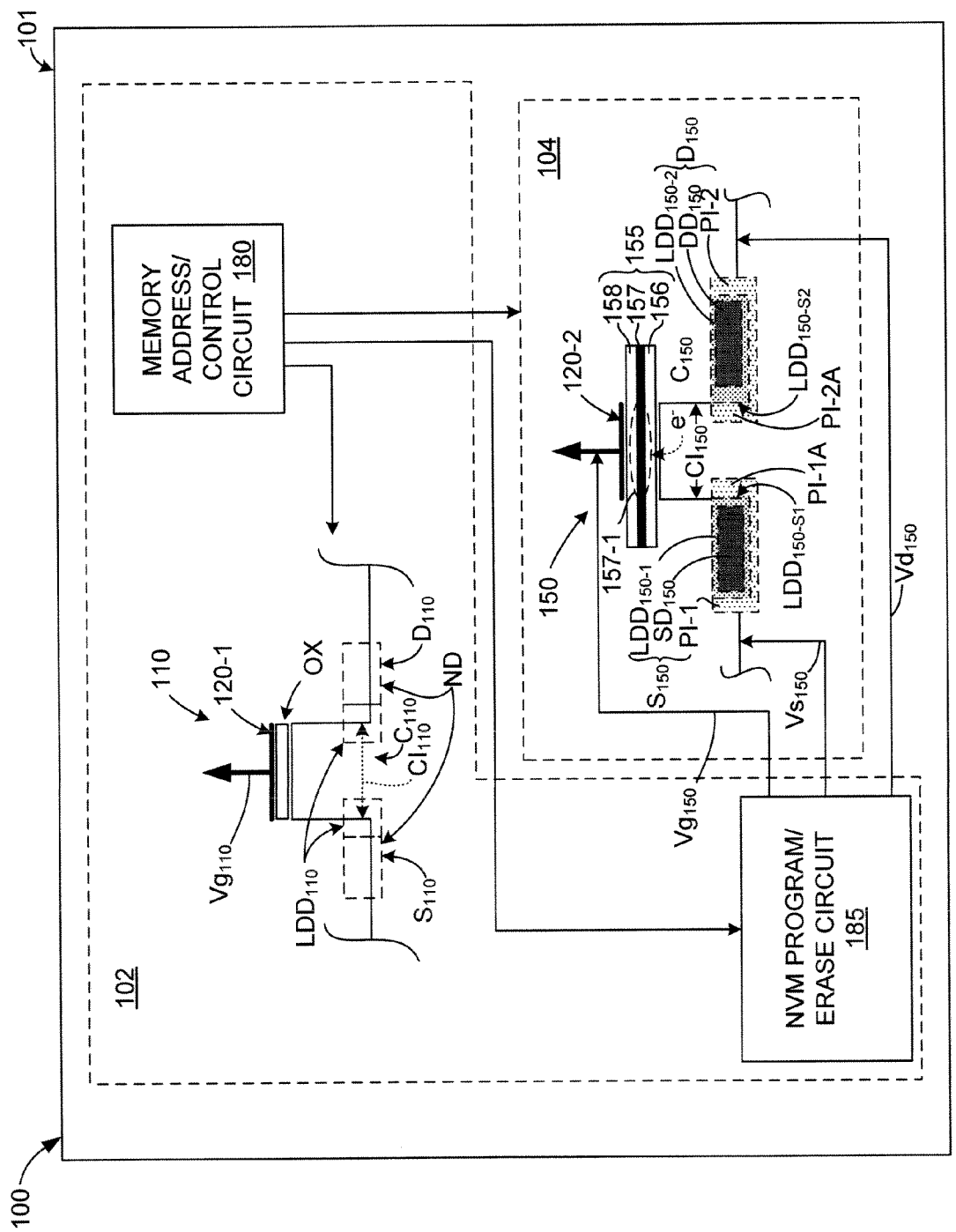
FIG. 1 is a simplified circuit diagram showing a CMOS IC including a standard N-type CMOS MOSFET and a CEONOS NMOS NVM cell according to an embodiment of the present invention.

FIG. 1 is a simplified diagram showing a CMOS integrated circuit (IC) 100 according to a generalized embodiment of the present invention. CMOS IC 100 is fabricated on a single semiconductor substrate 101 (e.g., a single monocrystalline silicon "chip") having a standard CMOS (first) region 102 in which "standard" CMOS components (e.g., NMOS cell 110) are formed according to conventional CMOS process techniques, and a modified CMOS (second) region 104 in which cost-efficient SONOS (CEONOS) non-volatile memory (NVM) cells 150 are formed in accordance with the modified methodology set forth below.

Standard CMOS region 102 includes standard CMOS elements that are arranged and connected in accordance to known methods to provide desired logic functions (e.g., data processing circuitry, not shown) and control functions (e.g., memory address/control circuit 180). One such standard CMOS element shown in FIG. 1 is an N-type MOSFET (NMOS) cell 110.

Referring to the top left portion of FIG. 1, NMOS cell 110 includes a source region $S_{110}$ and a drain region $D_{110}$ separated by a p-type channel region $C_{110}$. Formed over channel region $C_{110}$ is a polysilicon gate structure 120-1 that is separated from an upper surface of substrate 101 by a gate oxide layer OX. NMOS cell 110 also includes n-type LDD regions $LDD_{110}$ having a first (relatively high but lower than source/drain N+ doping levels) doping concentration that are connected to each of source region $S_{110}$ and drain region $D_{110}$ and extend into channel region $C_{110}$. As understood by those skilled in the art, NMOS cell 110 operates to pass a data signal between source region $S_{110}$ and drain region $D_{110}$ when a control signal applied to gate structure 120-1 is above a threshold voltage Vt determined by the cell's physical characteristics (e.g., source/drain engineering, channel length, etc.). That is, the operating state of NMOS cell 110 (i.e., "on" such that the data signal is passed from the source to the drain, or "off" such that passage of the data signal is prevented) is entirely controlled by the gate voltage applied to gate structure 120-1.

Modified CMOS region 104 includes CEONOS NVM cells (e.g., CEONOS NVM cell 150) that are utilized to store information in a non-volatile manner such that the stored data is accessible by way of memory address/control circuit 180 for use in the process and control circuitry of IC 100. Although only a single CEONOS NVM cell 150 is shown in FIG. 1, it is understood that modified CMOS region 104 includes a large number of CEONOS NVM cells arranged in an array (e.g., as set forth below).

The size and general arrangement of CEONOS NVM cell 150 is similar to that of NMOS cell 110. Like NMOS cell 110, CEONOS NVM cell 150 includes a source region $S_{150}$ and a drain region $D_{150}$ that are separated by a channel region $C_{150}$, and a polysilicon gate structure 120-2 disposed over channel region $C_{150}$. Source region $S_{150}$, drain region $D_{150}$, channel region $C_{150}$, and polysilicon gate structure 120-2 are substantially the same size as corresponding structures of NMOS cell 110. Similar to the source/drain regions of NMOS cell 110, source region $S_{150}$ and drain region $D_{150}$ include one or more n-type dopant materials diffused into p-type semiconductor material, although in preferred embodiments source region $S_{150}$ and drain region $D_{150}$ are specially engineered in the manner described below to facilitate low voltage program/erase operations. Polysilicon gate structure 120-2 is essentially identical in composition and thickness to that of polysilicon gate structure 120-1, and in the preferred embodiment both of these gate structures are formed simultaneously. Because CEONOS NVM cell 150 occupies substantially the same chip area) as a standard NMOS transistor 110, CEONOS NVM cells can be formed in higher density arrays than most conventional NVM solutions because typical NOR memory cells are larger than minimum design rule CMOS transistors.

A first distinction between CEONOS NVM cell 150 and NMOS cell 100 in that, instead of utilizing a gate oxide layer that serves only to electrically insulate the source/drain and channel regions from the gate structures, CEONOS NVM cell 150 includes an Oxide-Nitride-Oxide (ONO) stack 155 that facilitates non-volatile memory operations. ONO stack 155 is disposed between substrate 101 and polysilicon gate structure 120-2, and includes a lower (first) oxide layer 156, a central nitride layer 157, and an upper (second) oxide layer 158, where nitride layer 157 is electrically isolated from substrate 101 by lower oxide layer 157 and is electrically isolated from polysilicon gate structure 120-2 by upper oxide layer 158. ONO stack 155 thus differs from gate oxide layer OX in that it is thicker (i.e., the overall thickness of ONO stack 155 is in the range of 100 A and 250 A, whereas the thickness of gate oxide layer OX is typically in the range of 20 A and 100 A) in technologies below 0.18 μm technology node, and in that ONO stack 155 includes nitride layer 155 having a physical thickness in the range of 30 A and 150 A). A portion 157-1 of nitride layer 157, which is generally located over channel region $C_{150}$, serves as an electrically isolated "floating gate" (i.e., similar to isolated polysilicon structures in conventional EEPROM cells) that can be repeatedly programmed and erased to control channel current $CI_{150}$ between source region $S_{150}$ and drain region $D_{150}$ during read operations, thereby allowing CEONOS NVM cell 150 to store data values (logic 0 or 1). Unlike doped polysilicon, which is used to form floating gates in conventional EEPROM cells, the nitride layer is non-conducting, so the charge stored in the drain region of portion 157-1 remains trapped (i.e., the electrons do not flow or otherwise migrate to other regions of nitride layer 157), thereby avoiding the need to pattern nitride layer 157 such that each CEONOS NVM cell has a nitride layer portion that is separate from all other CEONOS NVM cells (i.e., unlike doped polysilicon floating gates, a single contiguous nitride layer can extend over and be utilized by all CEONOS NVM cells of an array). By utilizing ONO stack 155 in place of gate oxide, CEONOS NVM cell 150 is capable of serving as a many-times programmable (MTP) NVM cell that can be used, for example, to store control setting and operational data when CMOS IC 100 is powered down.

To support NVM operations, CMOS IC 100 includes NVM program/erase circuitry 185 that is disposed on substrate 101 and connected by way of metal signal lines to apply gate voltage $Vg_{150}$ onto polysilicon gate structure 120-2, source voltage $Vs_{150}$ onto source region $S_{150}$, and drain voltage $Vd_{150}$ onto drain region $D_{150}$ during program and erase operations. As discussed in additional detail below, during program operations, suitable source, drain and gate "program" voltages are applied to CEONOS NVM cell 150 such that channel hot electrons e⁻ are generated in channel region $C_{150}$ that become trapped in the drain region of portion 157-1 of nitride layer 157A. The stored data bit (i.e., the trapped charge or absence thereof) can be subsequently "read", for example, by applying suitable gate, drain and source voltages, and reading the resulting channel current $CI_{150}$ passed to drain region $D_{150}$. That is, CEONOS NVM cell 150 is programmed, the stored charge in portion 157-1 reduces the electrical field in channel region $C_{150}$, whereby channel current $CI_{150}$ is repressed during read operations. The stored charge can be subsequently removed by applying suitable source, drain and gate "erase" voltages to CEONOS NVM cell 150 such that holes are injected into nitride layer portion 157-1, thus compensating the charge of the trapped electrons and enhancing channel current $CI_{150}$ during read operations. ONO stack structure 155 thus serves as a type of "floating gate" that can be repeatedly programmed and erased to store data values (logic 0 or 1) in the form of electric charges that control the cell's channel current during read operations (i.e., in a manner similar to that of a conventional EEPROM cell).

In accordance with an embodiment of the present invention, CEONOS NVM cell is fabricated using special source/drain engineering process to provide an enhanced lateral field for program/erase operations that facilitates low voltage program/erase operations. In particular, source region $S_{150}$ includes a (first) N+ implant $SD_{150}$, a (first) n-type lightly-doped drain extension diffusion (LDD) implant $LDD_{150-1}$ and a (first) p-type pocket implant PI-1, and drain region $D_{150}$ includes a (second) N+ implant $DD_{150}$, a (second) n-type LDD implant $LDD_{150-2}$ and a (second) p-type pocket implant PI-2. Each LDD implant $LDD_{150-1}$ and $LDD_{150-2}$ is formed by an n-type dopant material diffused into substrate 101. Channel region $C_{150}$ is defined between a (first) inside boundary $LDD_{150-S1}$ of LDD implant $LDD_{150-1}$, and a (second) inside boundary $LDD_{150-S2}$ of LDD implant $LDD_{150-2}$. As described below, LDD implants $LDD_{150-1}$ and $LDD_{150-2}$ differ from N-type LDD diffusions of NMOS cell 110 in that they are implanted at a higher energy in order to pass through ONO stack 155, and have a higher doping concentration to facilitate high electric fields necessary for low voltage program/erase operations described below. Pocket implants PI-1 and PI-2 comprise a p-type dopant material diffused into substrate 101 such that respective portions PI-1A and PI-2A extend from inside LDD boundaries $LDD_{150-S1}$ and $LDD_{150-S2}$ into channel region $C_{150A}$. As described in additional detail below, forming the source and drain regions with both LDD and pocket implants facilitates enhanced lateral field for program/erase operations, thus facilitating desirable hot electron programming of nitride layer 157 using low program/erase voltages.

Figure 2:
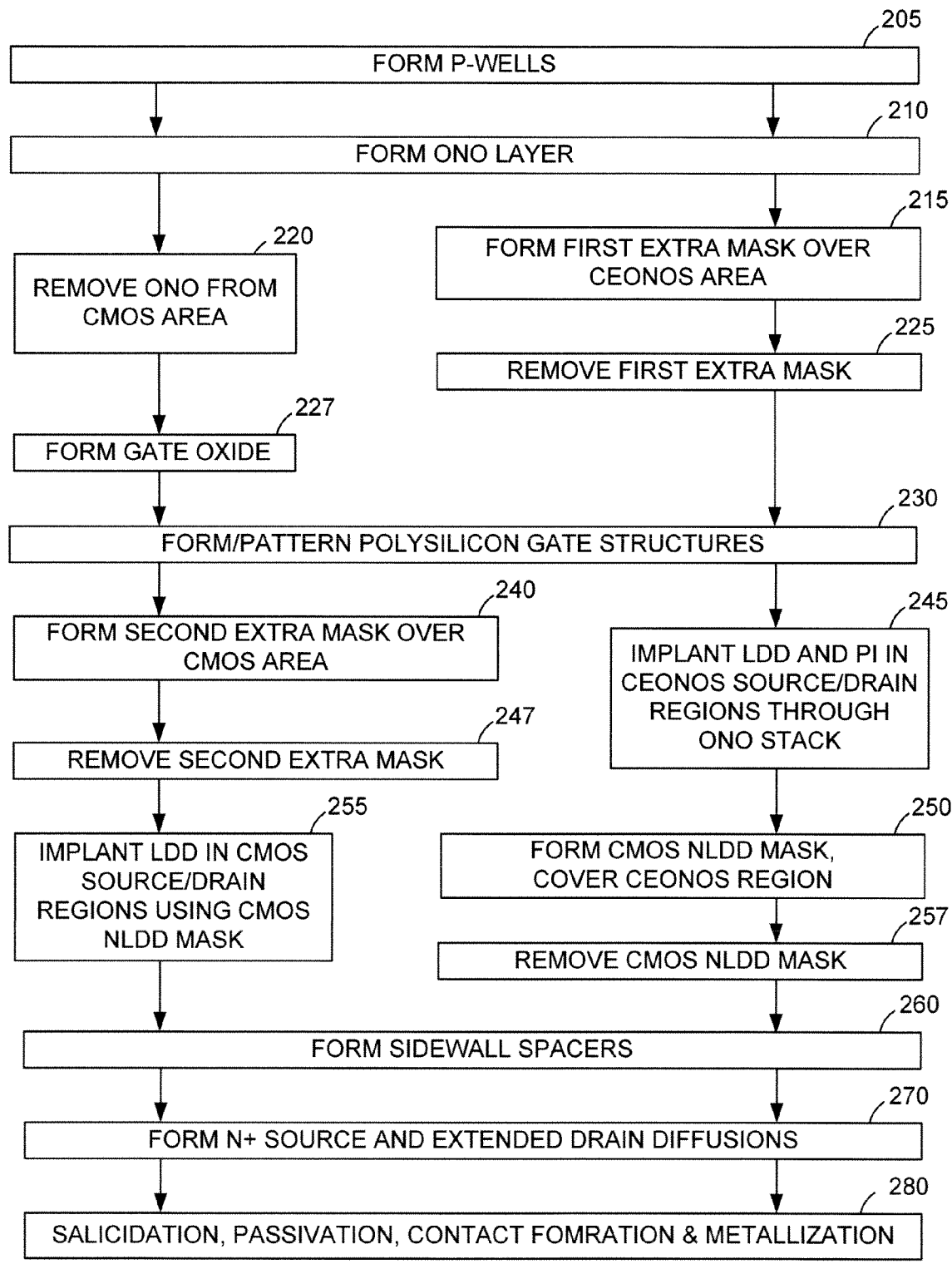
FIG. 2 is a flow diagram depicting a modified CMOS flow utilized to produce CMOS circuit of FIG. 1 according to another embodiment of the present invention.
Figure 3A:
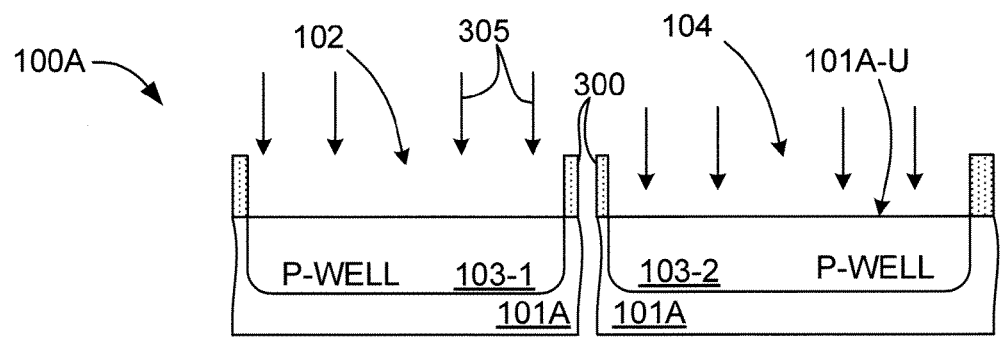
FIGS. 3(A), 3(B), 3(C), 3(D), 3(E), 3(F), 3(G), 3(H), 3(I), 3(J), 3(K), 3(L), 3(M), 3(N) and 3(O) are simplified cross-sectional side views showing portions of a CMOS IC during various stages of a modified CMOS flow according to a specific embodiment of the present invention.
Figure 3B:
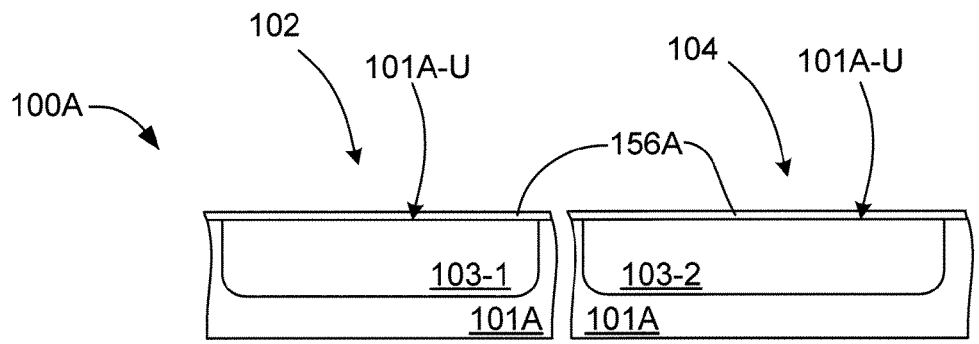
Figure 3C:
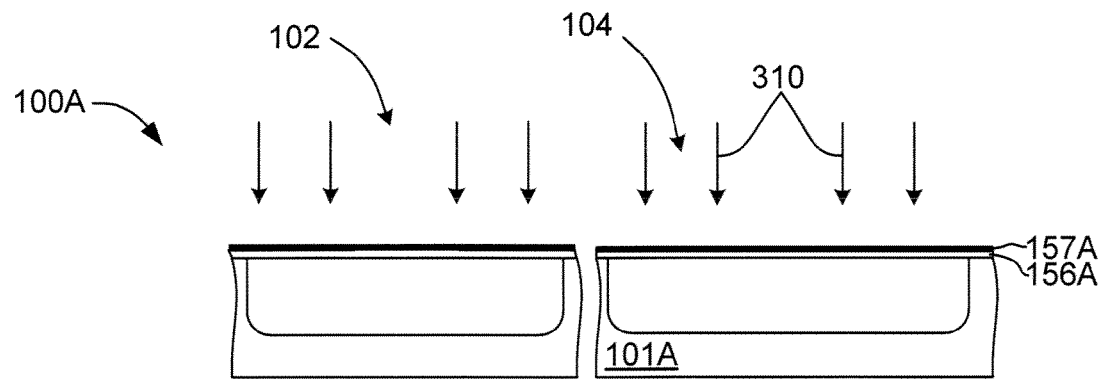
Figure 3D:
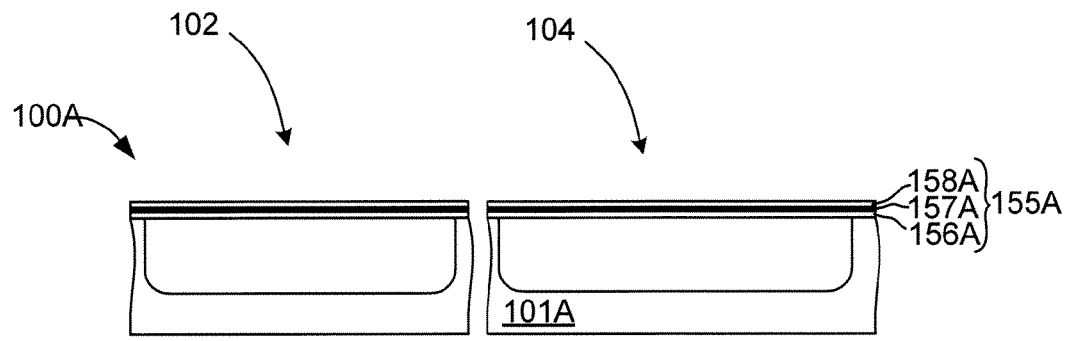
Figure 3E:
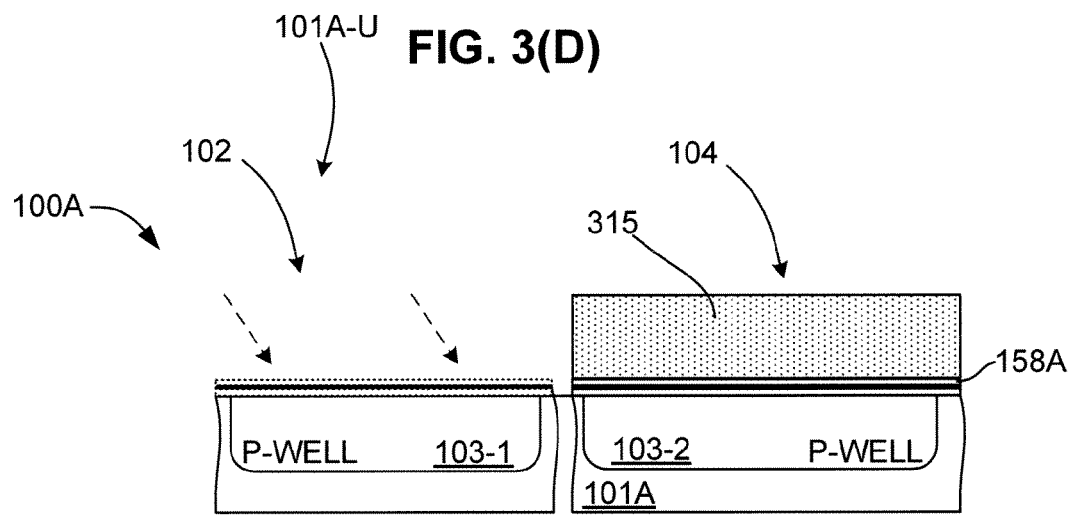
Figure 3F:
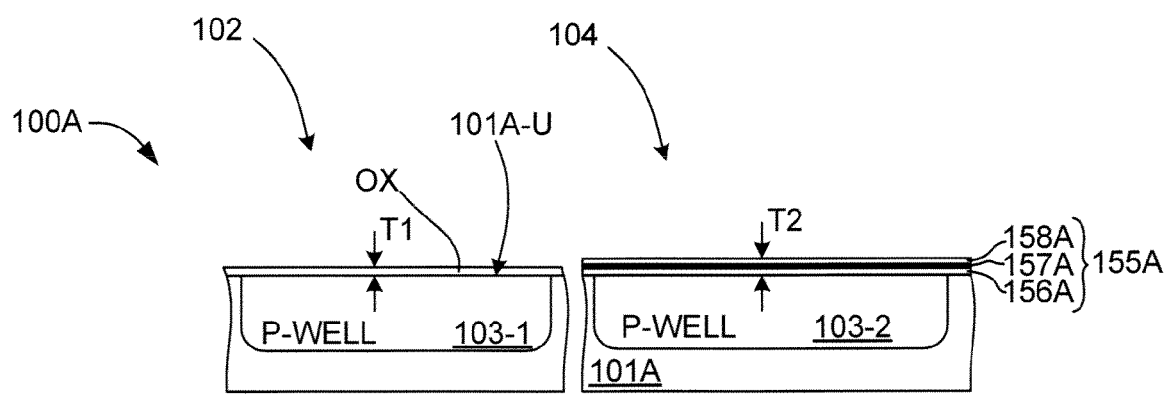
Figure 3G:
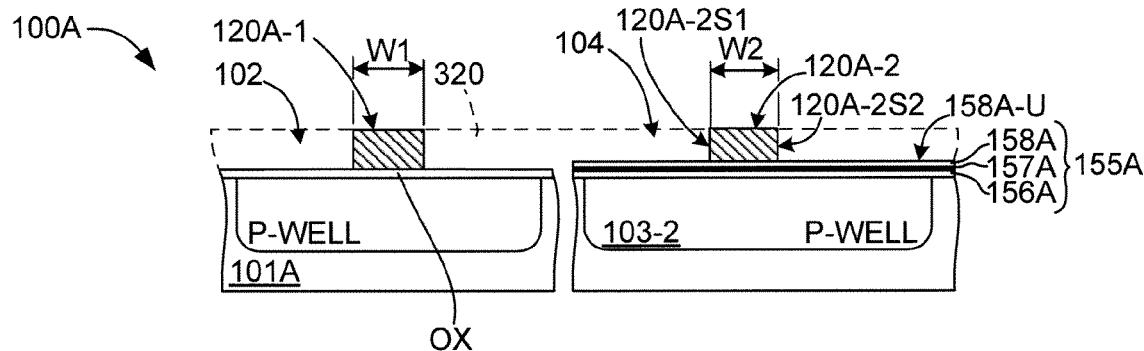
Figure 3H:
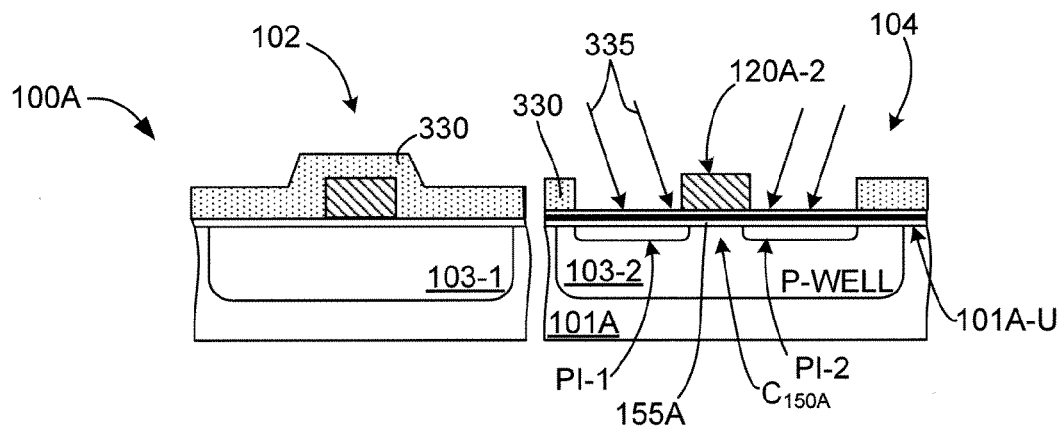
Figure 3I:
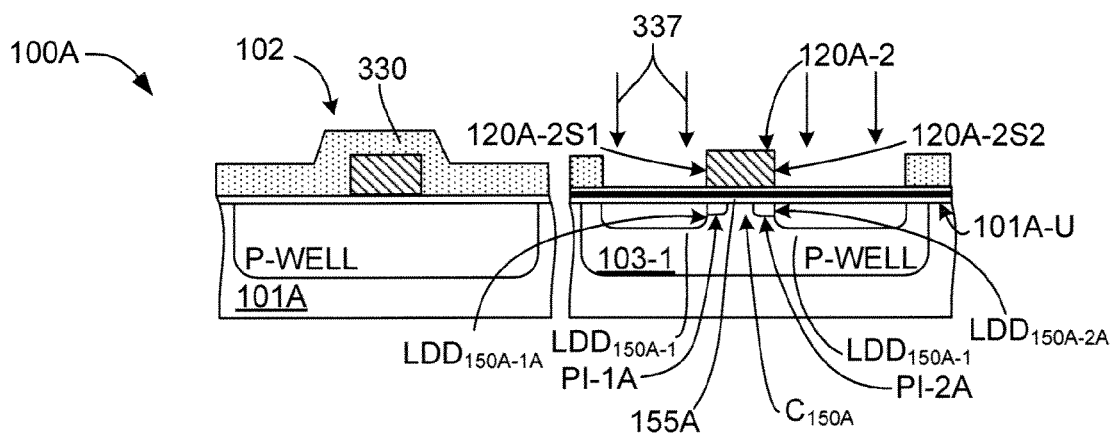
Figure 3J:
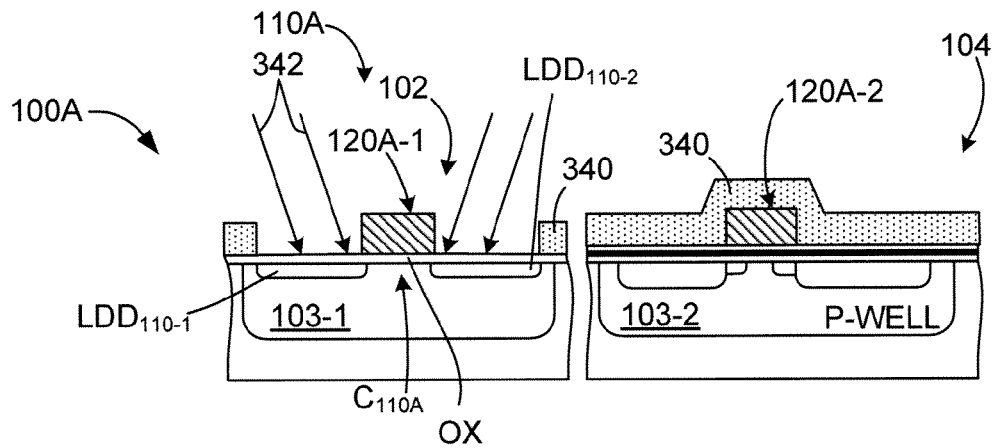
Figure 3K:
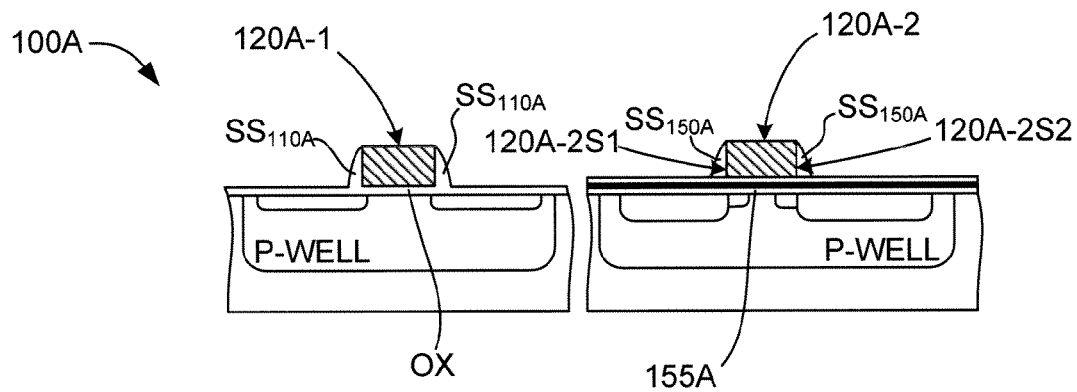
Figure 3L:
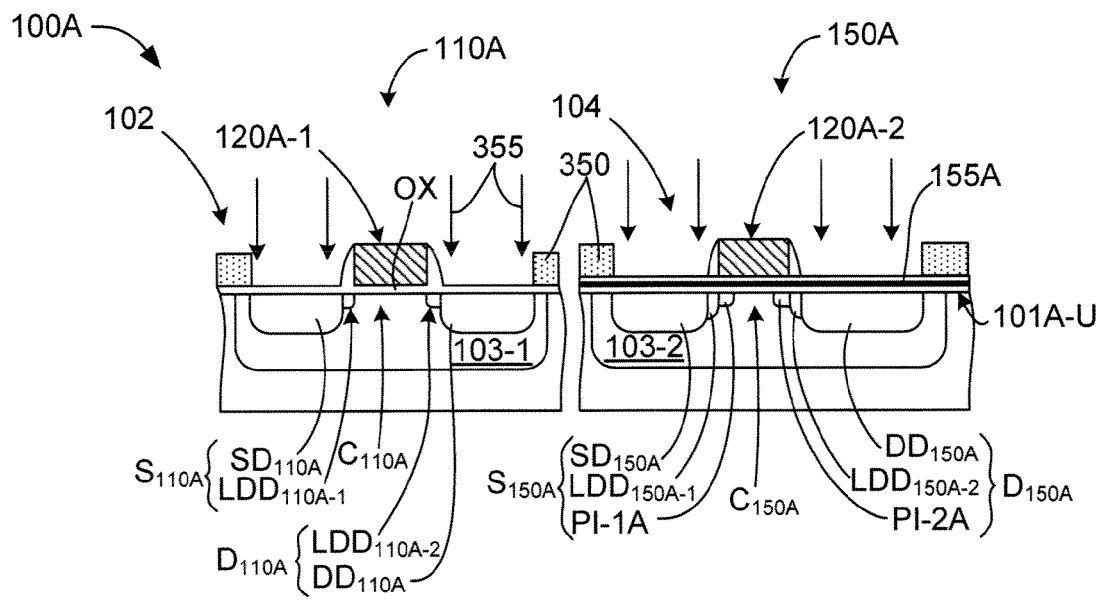
Figure 3M:
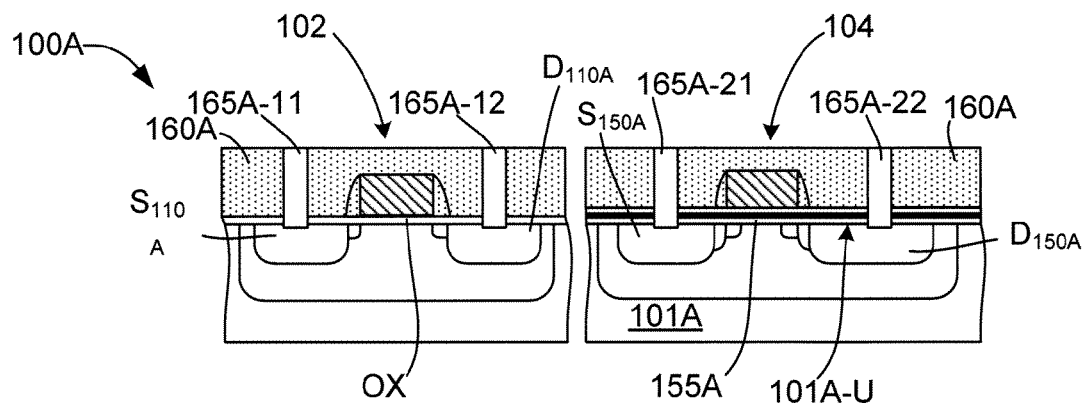
Figure 3N:
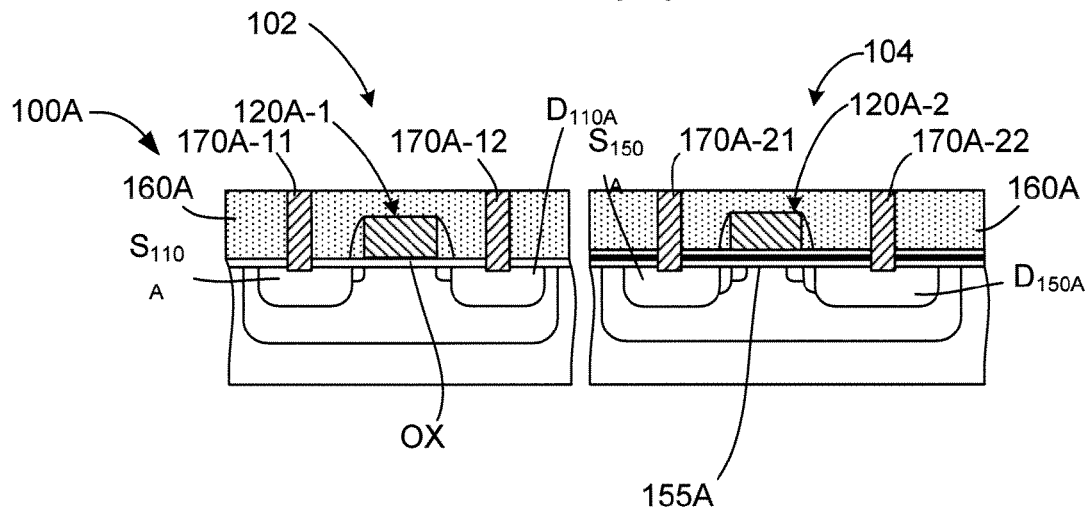
Figure 3O:
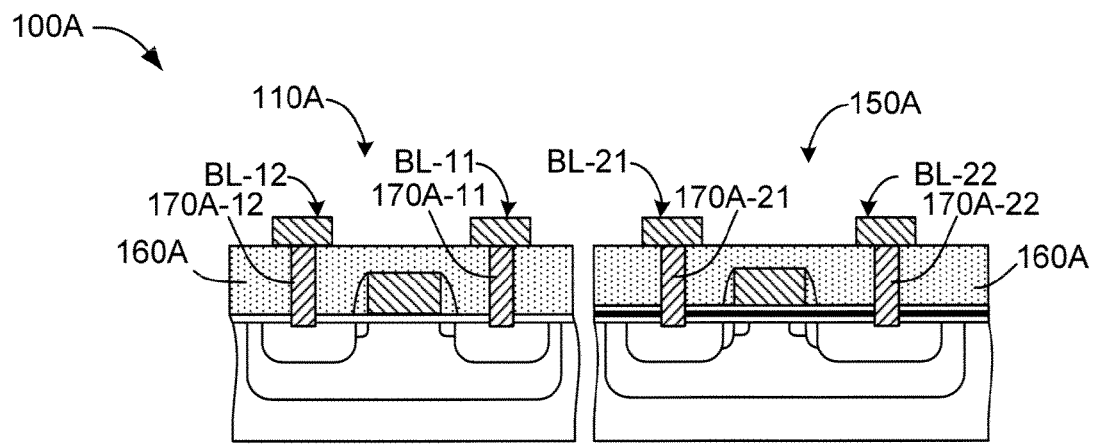

CMOS 100 is produced using an otherwise standardized CMOS process flow that is depicted in FIG. 2 and further illustrated in FIGS. 3(A) to 3(O). The left side of FIG. 2 includes a generalized sequence of processes utilized in the fabrication of a "standard" NMOS cell according to a modified process, and the right side of FIG. 2 includes a sequence of processes utilized in the fabrication of CEONOS NVM cells. According to an aspect of the invention, CEONOS NVM cells are formed (fabricated) in region 104 substantially simultaneously with NMOS cells and other standard CMOS elements, utilizing many standard CMOS fabrication steps that are already included in the process flow, thereby minimizing costly changes to existing CMOS process flows. CMOS processes utilized to produce both standard NMOS cells and CEONOS NVM cells are represented by elongated horizontal boxes that extend across both columns in the figure, and processes that are performed only in regions containing the NMOS or CEONOS NVM cells are indicated by shorter horizontal boxes located on the right or left side of the figure. For example, because both NMOS cells and CEONOS NVM cells are formed in P-well diffusions, the uppermost box (i.e., "FORM P-WELLS", block 205) extends across both columns. In contrast, formation of the ONO stack only occurs in regions containing the CEONOS NVM cells, so the associated box (i.e., "FORM ONO STACK", block 220) is located only in the right side column of FIG. 2. FIGS. 3(A) to 3(O) depict specific process operations performed on NMOS and CEONOS NVM cells that are associated with the boxes of FIG. 2. Fabrications steps that are not essential to describe the present invention, such as those utilized to produce p-type MOSFETs, are omitted for brevity.

Referring to block 205 at the upper portion of FIG. 2 and to FIG. 3(A), after forming shallow trench isolation (STI, not shown), the CMOS process flow utilizes standard CMOS processes to form P-well (diffusion) regions 103-1 and 103-2 in a monocrystalline silicon substrate 101A, which define the boundaries of the subsequently formed NMOS and CEONOS NVM cells. As indicated in FIG. 3(A), this standard CMOS process typically involves forming and patterning a mask 300 that defines suitable openings over substrate regions 102 and 104, and then implanting a p-type dopant 305 (e.g., Boron) through upper surface 101A-U of substrate 101 using known techniques such that P-well regions 103-1 and 103-2 are formed simultaneously, which define the boundaries of the subsequently formed NMOS and CEONOS NVM cells, respectively.

Referring to block 210 of FIG. 2 and to FIGS. 3(B), 3(C) and 3(D), the CMOS process flow utilized to form IC 100A next includes the non-standard CMOS process of forming an ONO layer on upper surface 101A-U of substrate 101A. As indicated in these figures, the ONO layer is formed over the entire surface of substrate 101A (i.e., in both CMOS region 102 and in CEONOS region 104). Referring to FIG. 3(B), ONO layer formation begins with the formation of a lower oxide layer 156A on upper surface 101A-U of substrate 101A over P-well regions 103-1 and 103-2. In one embodiment, lower oxide layer 156A comprises $SiO_2$ formed using known techniques and has a thickness in the range of 35 and 50 Angstroms. Referring to FIG. 3(C), a nitride material 315 is deposited using chemical vapor deposition (CVD) process (e.g., dichlorsilane and ammonia at 700-750° C.) such that a nitride layer 157A is formed on lower oxide layer 156A having a physical thickness in the range of 30 and 150 Angstroms. Note that nitride layer 157A is formed on lower oxide layer 156A such that it is electrically isolated from substrate 101A by lower oxide layer 156A. Referring to FIG. 3(D), the formation of ONO layer 155A is completed in CMOS region 102 and CEONOS region 104 with the formation of an upper oxide layer 158A (e.g. $SiO_2$) having a physical thickness in the range of 60 and 200 Angstroms on the upper surface of nitride layer 157A.

Referring to blocks 215, 220 and 225 of FIG. 2 and to FIGS. 3(E) and 3(F), a first non-standard "extra" mask 315 (i.e., a mask that is not included in the otherwise standard CMOS flow) is utilized to remove ONO layer material from CMOS region 102 of CMOS IC 100A. In particular, as shown in FIG. 3(E), mask 315 is patterned to cover the upper surface of upper oxide layer 158A in CEONOS region 104 (i.e., over P-well region 103-2), and to expose portions of the ONO layer that are disposed in CMOS region 102 (and any other regions of substrate 101A from which the ONO layer is to be removed). The ONO layer is then removed from CMOS region 102 (block 220, FIG. 2) using known techniques (as indicated by the dash-lined arrows in FIG. 3(E)), and mask 315 is removed (block 225, FIG. 2). CMOS region 102 is then processed as required to form a suitable gate oxide layer OX (block 227, FIG. 2) on upper surface 101A-U in CMOS region 102 (as indicated in FIG. 3(F)). In one embodiment, gate oxide layer OX comprises $SiO_2$ having a nominal thickness T1 of, e.g., 20-40 Angstroms in the case of low voltage NMOS transistors and 50-150 Angstroms in the case of high voltage NMOS transistors. As indicated in FIG. 3(F), the first "extra" mask is removed from CEONOS region 104 to expose the residual ONO layer, from this point on will be referred to as ONO stack 155A. In one embodiment, ONO stack 155A which has a total thickness T2 (i.e., including lower oxide layer 156A and upper oxide layer 158A, with nitride layer 157A sandwiched therebetween) in the range of 100 to 250 Angstroms.

Referring to block 230 of FIG. 2 and to FIG. 3(G), polysilicon gate structures 120A-1 and 120A-2 are then simultaneously respectively formed over regions 102 and 104 (i.e. on gate oxide layer OX in region 102 and on upper surface 158A of ONO stack 155A in region 104) using polysilicon processing techniques of the core CMOS flow. In one embodiment, the CMOS process flow includes a single polysilicon layer 320 having a thickness of approximately 2000 Angstroms that is deposited on oxide layer OX in region 102 (per standard CMOS practice), and also onto upper surface 158A-U of upper oxide layer 158A in region 104. Polysilicon layer 320 is then patterned (i.e., masked and etched) according to standard CMOS practices in both regions 102 and 104 (i.e., a single mask and single etch are used), whereby residual portion of polysilicon layer 320 form polysilicon gate structure 120A-1 in region 102 and polysilicon gate structure 120A-2 in region 104. Referring to the right side of FIG. 3(G), polysilicon gate structure 120-2 is entirely disposed over p-well region 103-2 and includes opposing side edges 120A-2S1 and 120A-2S2 that extend away from ONO stack 155A, where side edges 120A-2S1 and 120A-2S2 define a width W2 of gate structure 120A-2. In one embodiment both gate structures 120A-1 and 120A-2 are respectively formed with widths W1 and W2, which may be equal or different. In an exemplary case, width W2 of gate structure 120A-2 is in the range of 0.18 to 0.5 µm using 0.18 µm (micron) CMOS flow technology, and width W1 of gate structure 120A-1 is greater than (or equal to) 0.18 µm using 0.18 µm technology. In alternative embodiments an intermediate layer may be formed between polysilicon layer 320 and ONO stack 155A.

Blocks 240, 245 and 247 of FIG. 2 and FIGS. 3(H) and 3(I) illustrate a second non-standard CMOS process associated with special drain engineering utilized in the formation of CEONOS NVM cells, which involves forming a second extra mask over CMOS region 102 (block 240), then performing the implants through openings in the mask in CEONOS region 104 (block 245), then removing the second extra mask (block 247). Each of these processes is described in additional detail in the following paragraphs. Referring to block 240 of FIG. 2 and to FIG. 3(H), a second extra mask 330 is formed patterned as shown such that it entirely covers CMOS region 102 to protect the standard CMOS elements during the CEONOS drain engineering process. In one embodiment mask 330 is patterned to expose polysilicon gate structure 120A-2 and portions of ONO stack 155A that are adjacent to polysilicon gate structure 120A-2 (i.e., the exposed portions are located over the to-be-formed source and drain regions of the CEONOS cell). Next, as indicated by block 245 of FIG. 2, the special drain engineering is performed through the openings defined in second extra mask 330. According to an embodiment of the present invention, this special drain engineering regions involves implanting two or more dopant materials such that the implanted materials pass through ONO stack 155A and into P-well region 103-2. In a specific embodiment, these implants include forming both n-type lightly-doped drain extension diffusion (LDD) implants and p-type pocket implants in each of the source/drain areas using the methodology described below with reference to FIGS. 3(H) and 3(I). Although these figures indicate that the pocket implants are formed before the LDD implants, the order in which these implants are formed is not critical. Referring to FIG. 3(H), the process of forming (first and second) pocket implants PI-1 and PI-2 involves directing one or more p-type pocket implant dopants (materials) 335 at energy levels that allows the dopant to pass through the exposed portions of ONO stack 155A and diffuse into pocket implant 103-2. In one embodiment, the p-type pocket dopant is directed at acute angles relative to the normal to the upper substrate surface 101A-U (using known techniques) such that portions of the pocket implants PI-1 and PI-2 extend under polysilicon gate structure 120A-2. In one specific embodiment, the pocket implant formation process includes directing one of Boron molecules and Boron-difluoride molecules at energies in the range of 20 to 120 keV. Note that CMOS region 102 is covered by second extra mask 330, so that the PI implant material does not enter P-well region 103-1. Referring to FIG. 3(I), the second phase of the special drain engineering process, i.e., forming (first and second) LDD implants $LDD_{150A-1}$ and $LDD_{150A-2}$ in P-well region 103-2, involves directing one or more n-type implant materials 337 at energies that allows it to pass through the exposed portions of ONO stack 155A and diffuse into pocket implant 103-1. In one specific embodiment, LDD implants $LDD_{150A-1}$ and $LDD_{150A-2}$ are formed by implanting Arsenic (As) or Phosphorous (P) at energies in the range of 10 to 50 keV. In addition, n-type LDD dopant material 337 is directed perpendicular to upper substrate surface 101A-U (using known techniques) such that LDD implant $LDD_{150A-1}$ is formed with an inside boundary $LDD_{150A-1A}$ that is substantially aligned with side edge 120A-2A of polysilicon gate structure 120A-2, and such that second LDD implant LDD-2 is formed with an inside boundary $LDD_{150A-2A}$ that is aligned with side edge 120A-2S2 of polysilicon gate structure 120A-2. Note that portions PI-1A and PI-2A of pocket implants PI-1 and PI-2 respectively extend from LDD boundaries $LDD_{150A-1A}$ and $LDD_{150A-2A}$ into channel region $C_{150A}$. Second extra mask 330 is removed from region 102 after formation of the pocket implants (block 247, FIG. 2). Referring to blocks 250, 255 and 257 of FIG. 2 and to FIG. 3(J), following removal of the second extra mask, an n-type LDD (NLDD) implant is performed in CMOS region 102 according to standard CMOS techniques, including forming/patterning a CMOS NLDD mask 340 that exposes selected portion of CMOS region 102 and entirely covers CEONOS region 104 (block 250), then implanting NLDD materials 342 to form LLD implants $LDD_{110-1}$ and $LDD_{110-2}$ in P-well region 103-1 on opposite (first and second) sides of polysilicon gate 120A-1 (block 245), and then removing the CMOS NLDD mask (block 257). Note that CMOS NLDD mask 340 prevents LDD implant material 342 from entering P-well region 103-2. Referring to block 260 (FIG. 2) and to FIG. 3(K), following removal of the CMOS NLDD mask, sidewall spacers (oxide and nitride structures) are simultaneously formed on polysilicon gate structures 120A-1 and 120A-2, respectively, utilizing standard CMOS methodologies. Specifically, sidewall spacers $SS_{150A}$ are formed on side edges 120A-2S1 and 120A-2S2 of polysilicon gate structure 120A-2 and on ONO stack 155A of polysilicon gate structure 120A-2, and sidewall spacers $SS_{110A}$ are simultaneously formed on side edges of polysilicon gate structure 120A-1 and on gate oxide layer OX. Next, referring to block 270 (FIG. 2) and to FIG. 3(L), an N+ source/drain implant process is performed that forms N+ diffusions in the source and drain regions of NMOS cell 110A and CEONOS NVM cell 150A. The N+ source/drain implant process begins with the formation of an N+ implant mask 350 that is patterned according to the core CMOS flow to expose gates 120A-1 and source/drain regions of NMOS cell 110A in CMOS region 102. In addition, N+ implant mask is patterned in CEONOS region 104 in a similar manner to expose gates 120A-2 and source/drain regions of CEONOS NVM cell 150A. An n-type dopant 355 is then directed in accordance with the core CMOS flow through the openings in N+ implant mask 350 into the exposed portions of CMOS region 102 and CEONOS region 104, whereby N+ regions $SD_{110A}$ and $DD_{110A}$ are formed in each NMOS cell 110A, and N+ regions $SD_{150A}$ and $DD_{150A}$ are formed in each CEONOS NVM cell 150A. As indicated at the bottom of FIG. 3(L), the main structures forming NMOS cell 110A and CEONOS NVM cell 150A are now substantially formed. Referring to the left side of FIG. 3(L), NMOS cell 110A includes polysilicon gate structure 120A-1 disposed on oxide layer OX over channel region $C_{110A}$, a source region $S_{110A}$ formed by LDD implant $LDD_{110A-1}$ and N+ source diffusion $SD_{110A}$, and a drain region $D_{110A}$ formed by LDD implant $LDD_{110A-2}$ and N+ drain diffusion $DD_{110A}$. Similarly, as shown on the right side of FIG. 3(L), CEONOS NVM cell 150A includes polysilicon gate structure 120A-2 disposed on ONO stack 155A, which in turn is formed on upper substrate surface 101A-U such that it extends between source $S_{150A}$ and drain region $D_{150A}$ over channel region C150A. As indicated, source region $S_{150A}$ is formed by N+ implant $SD_{150A}$, LDD implant $LDD_{150A-1}$ and pocket implant PI-1A, and drain region $D_{150A}$ is formed by N+ implant $DD_{150A}$, LDD implant $LDD_{150A-2}$ and pocket implant PI-2A. Finally, referencing block 280 (FIG. 2) and FIGS. 3(M), 3(N) and 3(O), silicide formation is performed in CMOS region 102 of substrate 101A to facilitate contact with the respective source/drain and gate regions, and then pre-metal dielectric, contacts, and metallization (including inter-layer dielectrics and metal vias contacts) is performed simultaneously in CMOS region 102 and CEONOS region 104. Specifically, the standard CMOS flow is utilized to simultaneously form metal contact structures to the source/drain and gate regions of both the NMOS and CEONOS NVM cells (i.e., the present inventors have found that the standard CMOS via etch used to expose the NMOS source/drain regions may be easily modified to facilitate etching through (i.e., forming openings through) the ONO stack to form metal contacts between the source/drain regions of the CEONOS NVM cells and metal bit lines disposed in a metallization layer of the CMOS process.

Referring to FIG. 3(M), after silicide formation (not shown), a standard pre-metal dielectric material layer 160A is formed on substrate 101A over CMOS region 102 and CEONOS region 104 using parameters of the core CMOS flow. Next, openings are simultaneously formed (etched) through pre-metal dielectric layer 160A and into upper substrate surface 101A-U. Specifically, (first and second) openings 165A-21 and 165A-22 are formed through pre-metal dielectric layer 160A and ONO stack 155A to source region $S_{150A}$ and drain region $D_{150A}$, respectively, and (third and fourth) openings 165A-11 and 165A-12 are defined through pre-metal dielectric layer 160A and gate oxide layer OX to source region $S_{110A}$ and drain region $D_{110A}$, respectively. All of openings 165A-11, 165A-12, 165A-21 and 165A-22 are formed simultaneously.

Referring to FIG. 3(N), one or more first metals (e.g., tungsten or nickel) are then deposited over pre-metal dielectric layer 160A such that the metal(s) simultaneously enters into each of the openings to form metal via contact structures with corresponding silicide structures in CMOS region 102 and silicon/poly CEONOS region 104. Specifically, (first and second) metal contact structures 170A-21 and 170A-22 are formed in openings 160A-21 and 160A-22 such that they extend through ONO stack 155A and their lower ends contact silicon of source region $S_{150A}$ and drain region $D_{150A}$, respectively. Similarly, (third and fourth) metal contact structures 170A-11 and 170A-12 are formed in openings 165A-11 and 165A-12 such that they contact associated silicide structures formed on source region $S_{110A}$ and drain region $D_{110A}$, respectively (oxide portions were removed from these regions before silicidation process as part of the standard STD CMOS process flow). Residual metal is then removed from the upper surface of pre-metal dielectric layer 160A.

As indicated in FIG. 3(O), a second metal (e.g., Ti/TiN or aluminum) is then simultaneously deposited over pre-metal dielectric layer 160A and patterned to form bit-line structures that contact upper ends of each of the metal via contact structures, thereby completing the fabrication of NMOS cell 110A and CEONOS NVM cell 150A. Specifically, (first and second) bit-line structures BL-21 and BL-22 are formed on pre-metal dielectric layer 160A and contact the upper ends of contact structures 170A-21 and 170A-22, respectively, and (third and fourth) bit-line structures BL-11 and BL-12 are formed on pre-metal dielectric layer 160A and contact the upper ends of contact structures 170A-11 and 170A-12, respectively.

According to an optional "three extra mask" modified CMOS process flow, which may be used in place of the "two extra mask" approach described above with reference to FIGS. 2 and 3(A) to 3(O), the ONO layer is formed before the P-well regions, and the additional "extra" mask is used to remove a sacrificial oxide. Specifically, the ONO layer is formed and patterned using a first "extra" mask using the approach described in the "two extra mask" approach above, then a sacrificial oxide is produced on the substrate, and P-well implants are performed through the sacrificial oxide in the CMOS region and through the ONO stack in the CEONOS region. A second "extra" mask is then formed over the ONO stack and the sacrificial oxide is removed from the CMOS region. Polysilicon gates are then formed, and then the third "extra" mask is used to perform the CEONOS source/ drain engineering described above. The remaining processes are substantially identical to those of the "two extra mask" approach. Alternatively, a "two extra masks" approach is implemented by implantation of the P-well in both CMOS and CEONOS regions simultaneously through the ONO. In this case formation of additional sacrificial oxide is not necessary.

Figure 4:
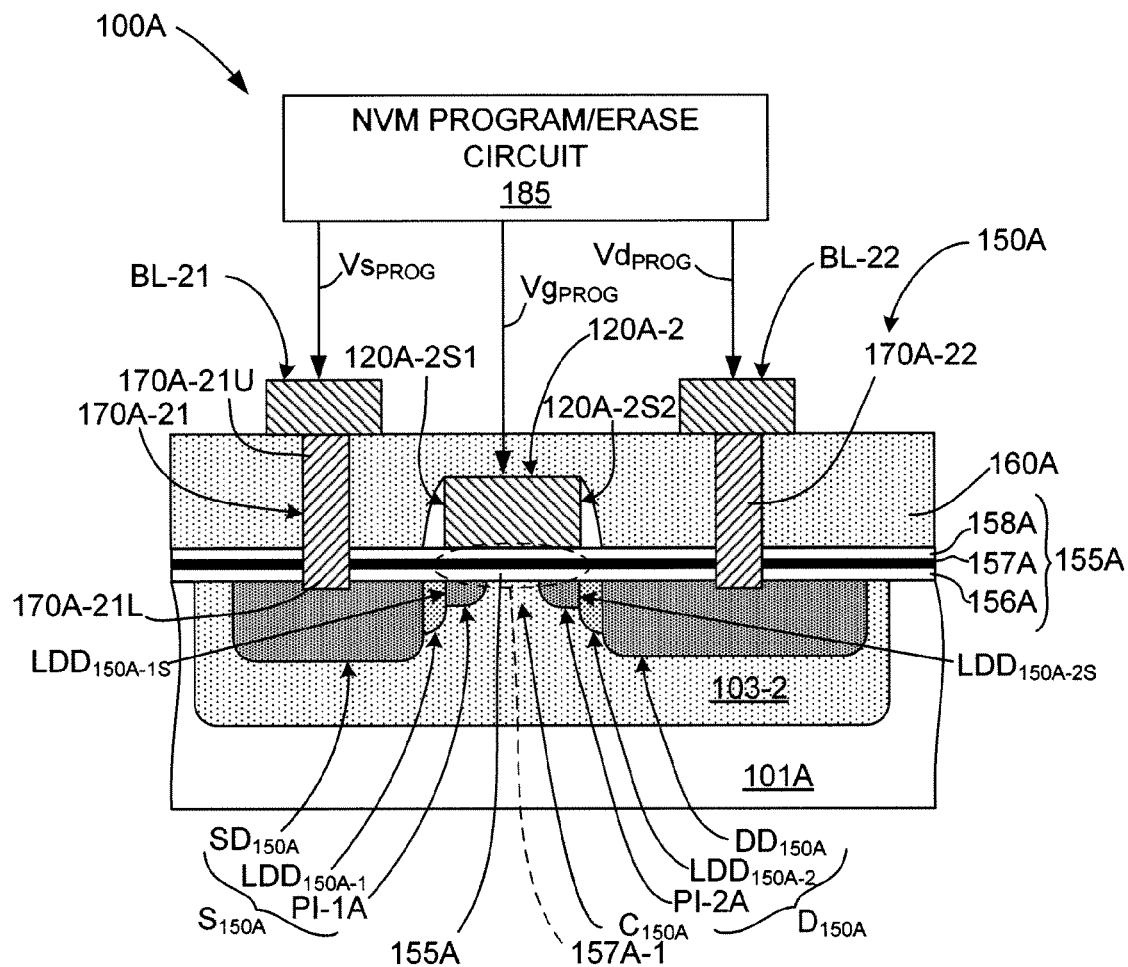
FIG. 4 is a cross-sectional side view showing the CEONOS NVM cell produced by the method of FIGS. 3(A) to 3(O) during a programming operation.

FIG. 4 includes an enlarged cross-sectional side view of CEONOS NVM cell 150A after completion of the modified CMOS process flow. As shown, CEONOS NVM cell 150A includes source region $S_{150A}$ and drain region $D_{150A}$ disposed inside P-well region 103-2 and separated by channel region $C_{150A}$, with polysilicon gate 120A-2 disposed on ONO stack 155A over channel region $C_{150A}$. Source region $S_{150A}$ includes N+ implant region $SD_{150A}$, n-type LDD implant $LDD_{150A-1}$ having inside LDD boundary $LDD_{150A-1S}$ that is aligned with side edge 120A-2S1 of poly gate structure 120A-2, and a p-type pocket implant having portion PI-1A extending from inside LDD boundary $LDD_{150A-1S}$ into channel region $C_{150A}$. Drain region $D_{150A}$ includes N+ implant region $DD_{150A}$, n-type LDD implant $LDD_{150A-2}$ having inside LDD boundary $LDD_{150A-2S}$ that is aligned with side edge 120A-2S2 of poly gate structure 120A-2, and a p-type pocket implant having portion PI-2A extending from inside LDD boundary $LDD_{150A-2S}$ into channel region $C_{150A}$. Note that N+ implants $SD_{150A}$ and $DD_{150A}$ are formed such that portions of LDD implants $LDD_{150-1}$ and $LDD_{150-2}$ are respectively disposed between inside edges of N+ implants $SD_{150A}$ and $DD_{150A}$ and portions PI-1A and PI-2A of pocket implants PI-1 and PI-2. Note also that the term "source region" and "drain region" are used herein solely to distinguish between the two sides of cell 150A. ONO stack 155A is formed such that nitride layer 157A is separated (electrically isolated) from source region $S_{150A}$ and drain region $D_{150A}$ by lower oxide layer 156A, and is separated from polysilicon gate structure 120A-2 by upper oxide layer 158A. By fabricating CEONOS NVM cell 150A in this manner, hot electron injection can be induced at a point below one of side edge 120A-2S1 and 120A-2S2 of polysilicon gate structure 120A-2 (where the vertical field has its highest values) by applying programming voltages at the gate, source and drain regions in accordance with the methodology described below, thus facilitating desirable hot electron programming of nitride layer 157A such that a charge is trapped in nitride layer drain region of portion 157A-1 above channel region $C_{150A}$.

The upper portion of FIG. 4 diagrams the transmission of programming signals from NVM program/erase circuit 185 to CEONOS NVM cell 150A during programming operations. As discussed above, NVM program/erase circuit 185 is fabricated on substrate 101A using conventional CMOS elements, and is configured to applying programming voltages $Vg_{PROG}$, $Vs_{PROG}$, $Vd_{PROG}$ respectively to source drain $S_{150A}$, drain region $D_{150A}$ and polysilicon gate structure 120A-2 such that channel hot electrons are generated in channel region $C_{150A}$ in a manner that causes them to become trapped in nitride layer portion 157A-1.

In a presently preferred embodiment described below with reference to FIGS. 5(A), 5(B) and 6, CEONOS NVM cell 150A is programmed using a Pulse Agitated Interface Substrate Hot Electron Injection (PAISHEI) programming technique in which negative programming (voltage) pulses are applied to drain region $D_{150A}$ (or source region $S_{150A}$) and positive programming pulses are applied to polysilicon gate structure 120A-2 (the other source/drain region is allowed to float). As described below, the combined drain engineering (described above) and PAISHEI programming approach facilitates programming at low voltages (e.g., 5V) by enhancing both the vertical and lateral components of the electric field after electron injection into substrate 101A from drain region $D_{150A}$.

Figure 5A:
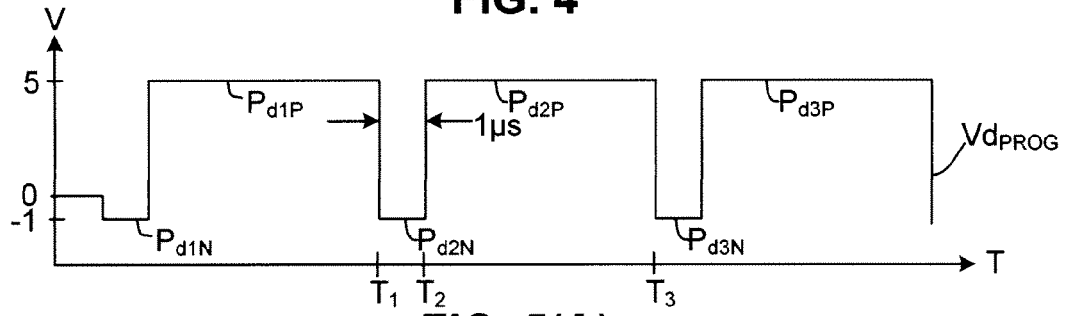
FIGS. 5(A) and 5(B) are timing diagrams showing pulse-type programming signals utilized to program the CEONOS NVM cell of FIG. 4 according to another specific embodiment of the present invention.
Figure 5B:
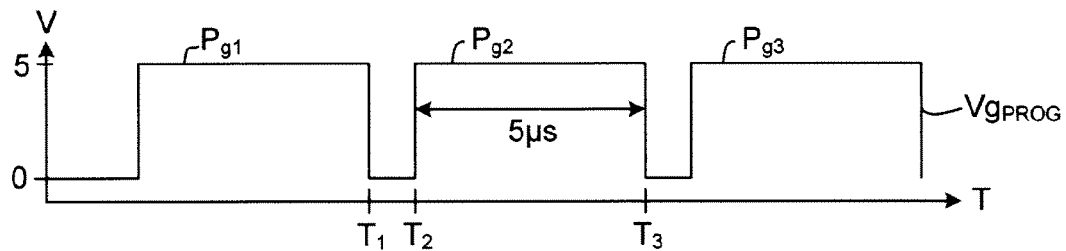

FIGS. 5(A) and 5(B) show programming voltages according to an exemplary PAISHEI programming regime. As indicated in these figures, drain voltage signal $Vd_{PROG}$ is generated in the form of negative programming pulse signals $P_{d1N}$, $P_{d2N}$, $P_{d3N}$ . . . followed immediately by positive programming pulses $P_{d1P}$, $P_{d2P}$, $P_{d3P}$ . . . (see FIG. 5(A)) that are applied to the drain region, and gate voltage signal $Vg_{PROG}$ is generated in the form of positive programming pulses $P_{g1}$, $P_{g2}$, $P_{g3}$ . . . (shown in FIG. 5(B)) that are transmitted to polysilicon gate structure 120A-2. The source voltage signal (not shown) is disconnected from a voltage source (i.e., floating). According to the exemplary embodiment, positive programming pulses $P_{g1}$, $P_{g2}$, $P_{g3}$ . . . associated with gate voltage signal $Vg_{PROG}$ and positive programming pulses $P_{d1P}$, $P_{d2P}$, $P_{d3P}$ . . . associated with drain voltage signal $Vd_{PROG}$ have at a nominal value of approximately 5V, and negative programming pulses $P_{d1N}$, $P_{d2N}$, $P_{d3N}$ . . . associated with drain voltage signal $Vd_{PROG}$ have a nominal value in the range of −0.5V and −1V. According to a specific embodiment, positive gate voltage signal programming pulses $P_{g1}$, $P_{g2}$, $P_{g3}$ . . . and positive drain voltage signal programming pulses $P_{d1P}$, $P_{d2P}$, $P_{d3P}$ . . . are generated simultaneously and have duration of 5 µs (microseconds), and negative programming pulses $P_{d1}$, $P_{d2}$, $P_{d3}$ . . . associated with drain voltage signal $Vd_{PROG}$ have duration of 1 µs. In addition, as indicated in FIG. 5(A), the positive programming pulses and the negative programming pulses are generated in an offset pattern (e.g., such that a negative programming pulse $P_{d2}$ is generated between times T1 and T2 while gate voltage signal $Vg_{PROG}$ is at 0V, and a next positive programming pulse $P_{g2}$ is generated between times T2 and T3 while drain voltage signal $Vd_{PROG}$ is at 5V).

Figure 6:
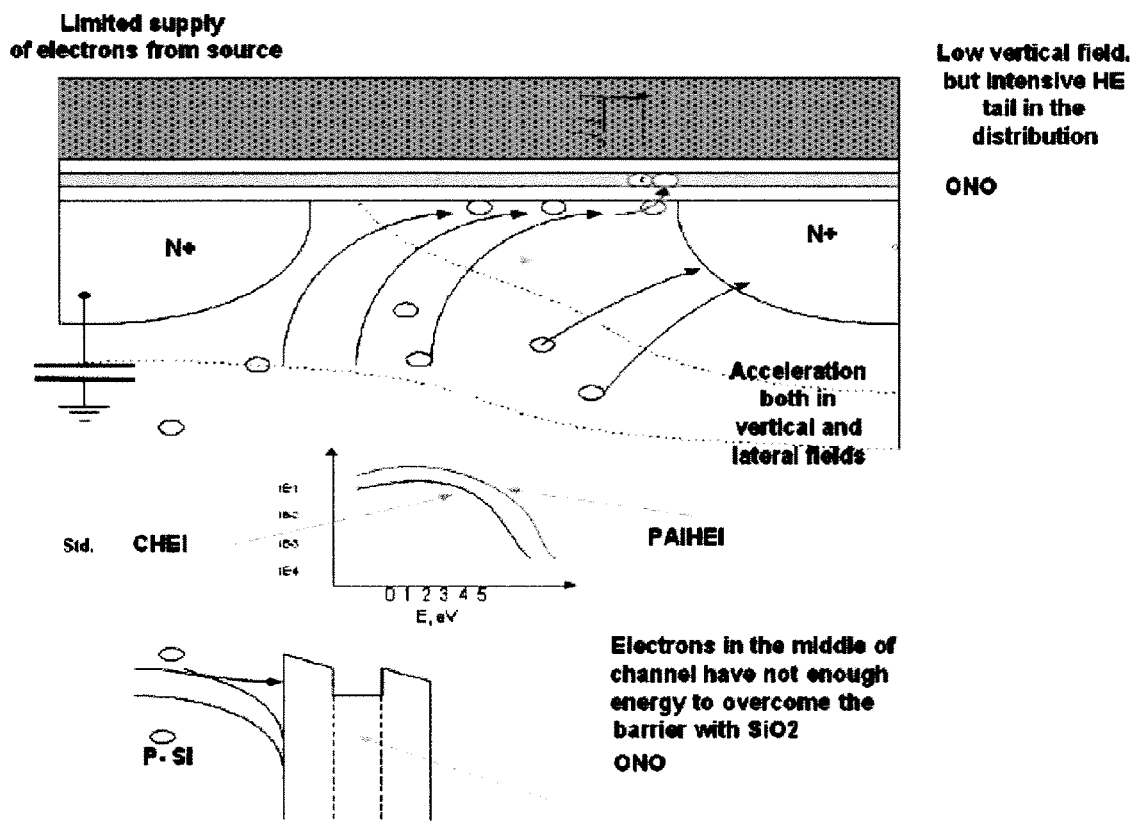
FIG. 6 is a diagram depicting electron flow generated in the CEONOS NVM cell of FIG. 4 in response to the applied PAISHEI programming signals of FIGS. 5(A) and 5(B)

FIG. 6 is a diagram depicting the effects of applying the PAISHEI programming voltages described above with reference to FIGS. 5(A) and 5(B). As depicted in this diagram, PAISHEI programming is characterized in that the electrons are injected into the bulk by a negative pulse at the drain (as in PASHEI). With the source kept floating during injection, the injected electrons are then collected towards the channel by a positive pulse at the drain. The electrons collected by the drain are heated in the channel by the lateral field in drain to bulk reverse biased p-n junction. The electrons are thus heated by two mechanisms: (i) by the gate voltage, like in PASHEI, and (ii) additionally heated like in standard CHE generation (lateral field) when moving in the channel. The electrons are thus injected in a forward direction and then pulled by high reverse field before they have time to recombine. This is more efficient then heating by lateral field or vertical fields separately. The advantage is that lower voltages can be used for programming of the memory cell to a given threshold voltage Vt for a given time.

Figure 7:
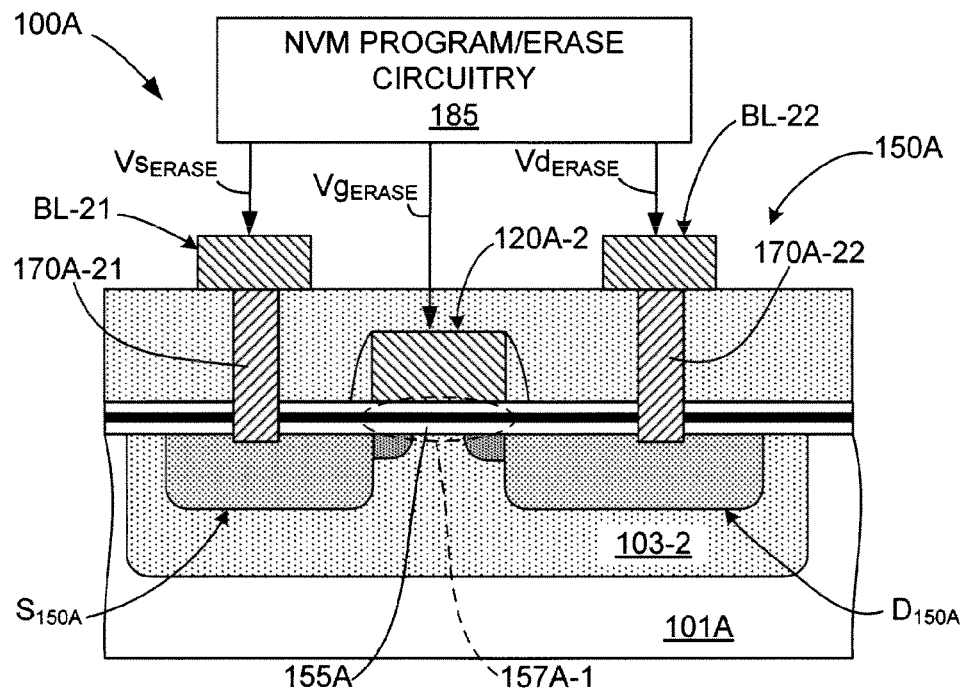
FIG. 7 is a cross-sectional side view showing the CEONOS NVM cell of FIG. 4 during an erase operation.

FIG. 7 is a diagram indicating the transmission of erase signals from NVM program/erase circuit 185 to CEONOS NVM cell 150A during erase operations. Specifically, to remove stored charges from nitride layer portion 157A, NVM program/erase circuit 185 applies erase voltages $Vs_{ERASE}$, $Vd_{ERASE}$, $Vg_{ERASE}$ respectively to source drain $S_{150A}$ (by way of bitline BL21 and metal contact 170A-21), drain region $D_{150A}$ (by way of bitline BL22 and metal contact 170A-22) and polysilicon gate structure 120A-2 such that holes are injected into nitride layer portion 157A, thereby reducing the stored charge. In one embodiment, erase operations are performed by applying a gate voltage $Vg_{ERASE}$ of −5V to gate structure 120A-2, a drain voltage $Vd_{ERASE}$ of 5V to drain region $D_{150A}$, thereby causing BBT generation of holes in drain region $D_{150A}$ that accelerate in the region between drain region $D_{150A}$ and gate structure 120A-2, and tunnel into drain region of the nitride layer portion 157A-1. The source terminal is kept at zero potential. This erase method is also utilized in conjunction with PAISHEI programming regimes.

Figure 8:
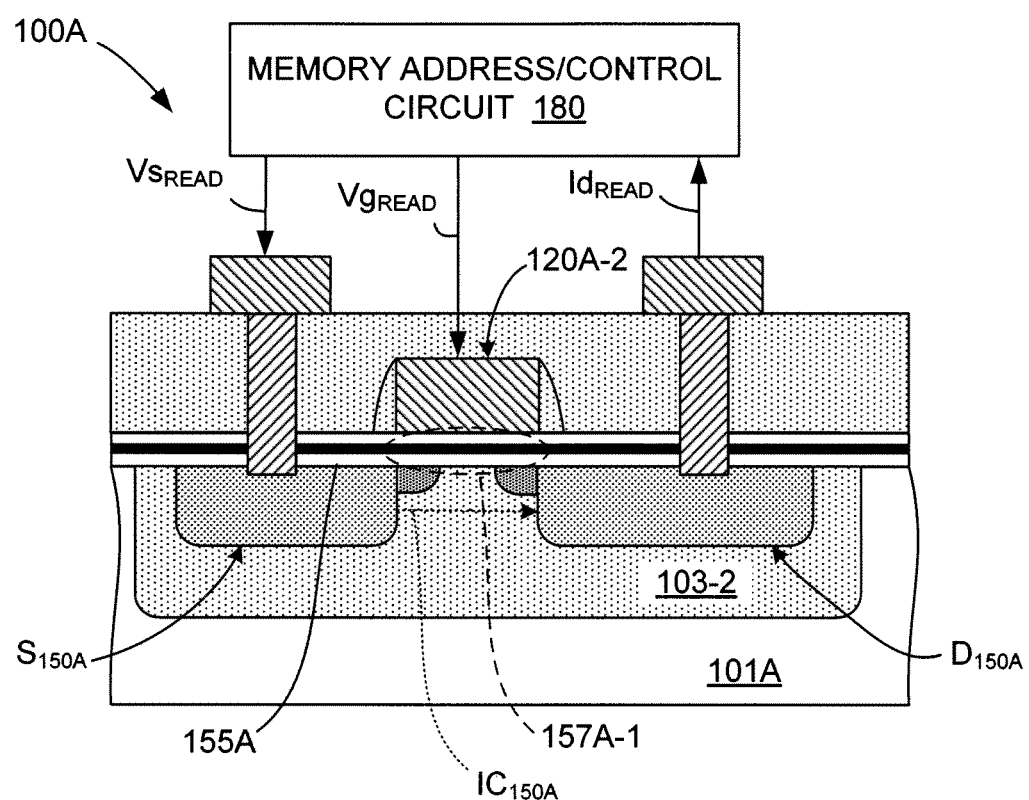
FIG. 8 is a cross-sectional side view showing the CEONOS NVM cell of FIG. 4 during a read operation.

FIG. 8 is a diagrams indicating read signals transmitted between memory address/control circuit 180 and CEONOS NVM cell 150A during a read operation. Specifically, to determine the presence or absence of a stored charges on nitride layer portion 157A, memory address/control circuit 180 applies read voltages $Vg_{READ}$ and $Vs_{READ}$ respectively to polysilicon gate structure 120A-2 and source drain $S_{150A}$, and measures the resulting drain current $Id_{READ}$ at drain region $D_{150A}$. When CEONOS NVM cell 150A is programmed (i.e., nitride portion 157A stores a net negative charge), the threshold voltage $Vt_{PROG}$ of CEONOS NVM cell 150A is relatively high (e.g., 4.5V or higher), and when CEONOS NVM cell 150A is erased (i.e., nitride portion 157A stores a net positive or neutral charge), the threshold voltage $Vt_{ERASE}$ of CEONOS NVM cell 150A is relatively low (e.g., 3V or less). Gate voltage $Vg_{READ}$ is set at an intermediate (e.g., at 3.5V) such that CEONOS NVM cell 150A remains off (i.e., channel current $CI_{150A}$ is essentially zero) when CEONOS NVM cell 150A is programmed, and such that CEONOS NVM cell 150A turns on (i.e., channel current $CI_{150A}$ is detectable) when CEONOS NVM cell 150A is erased.

Figure 9:
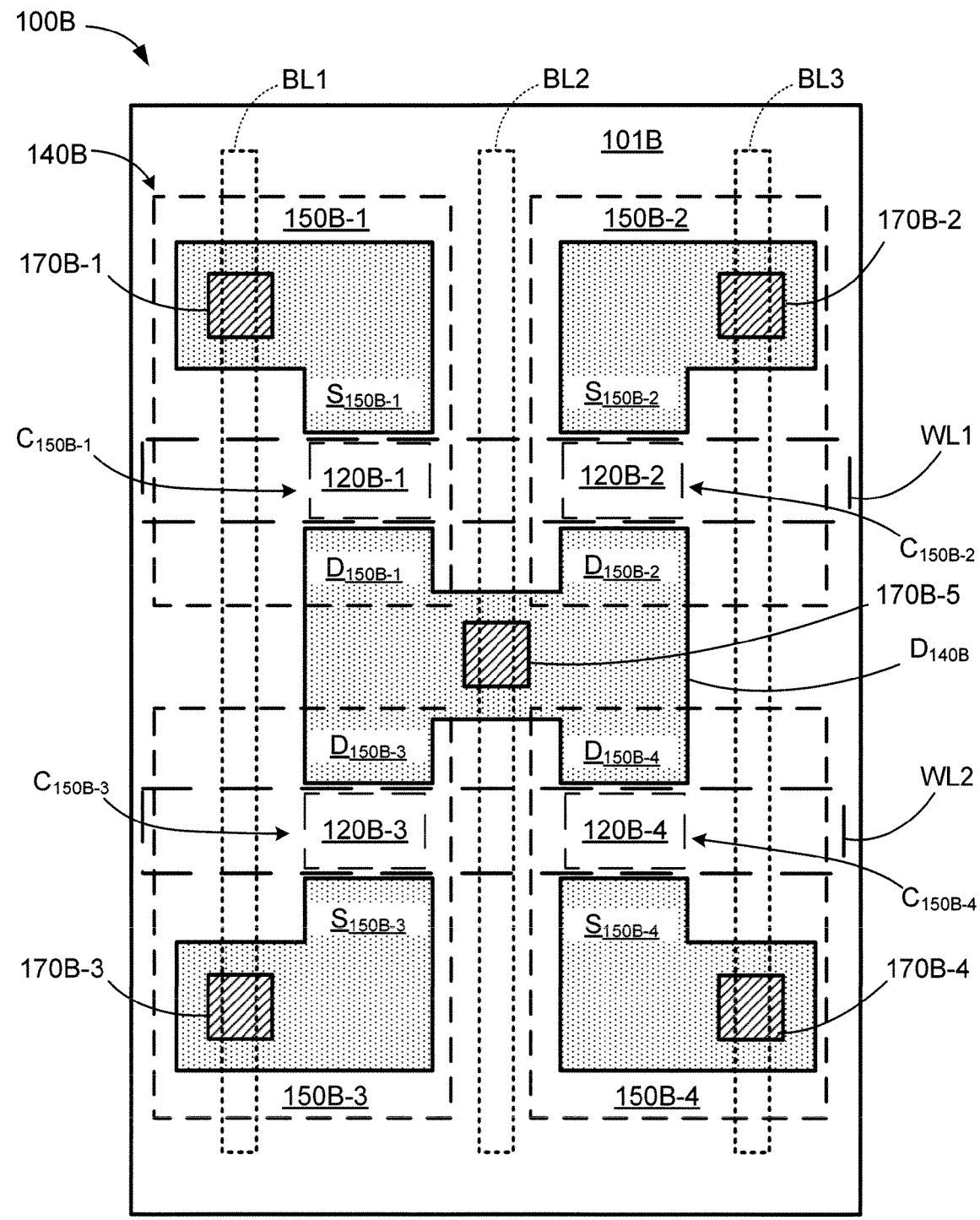
FIG. 9 is simplified top plan (layout) view showing a CEONOS cell group according to yet another specific embodiment of the present invention.
Figure 10A:
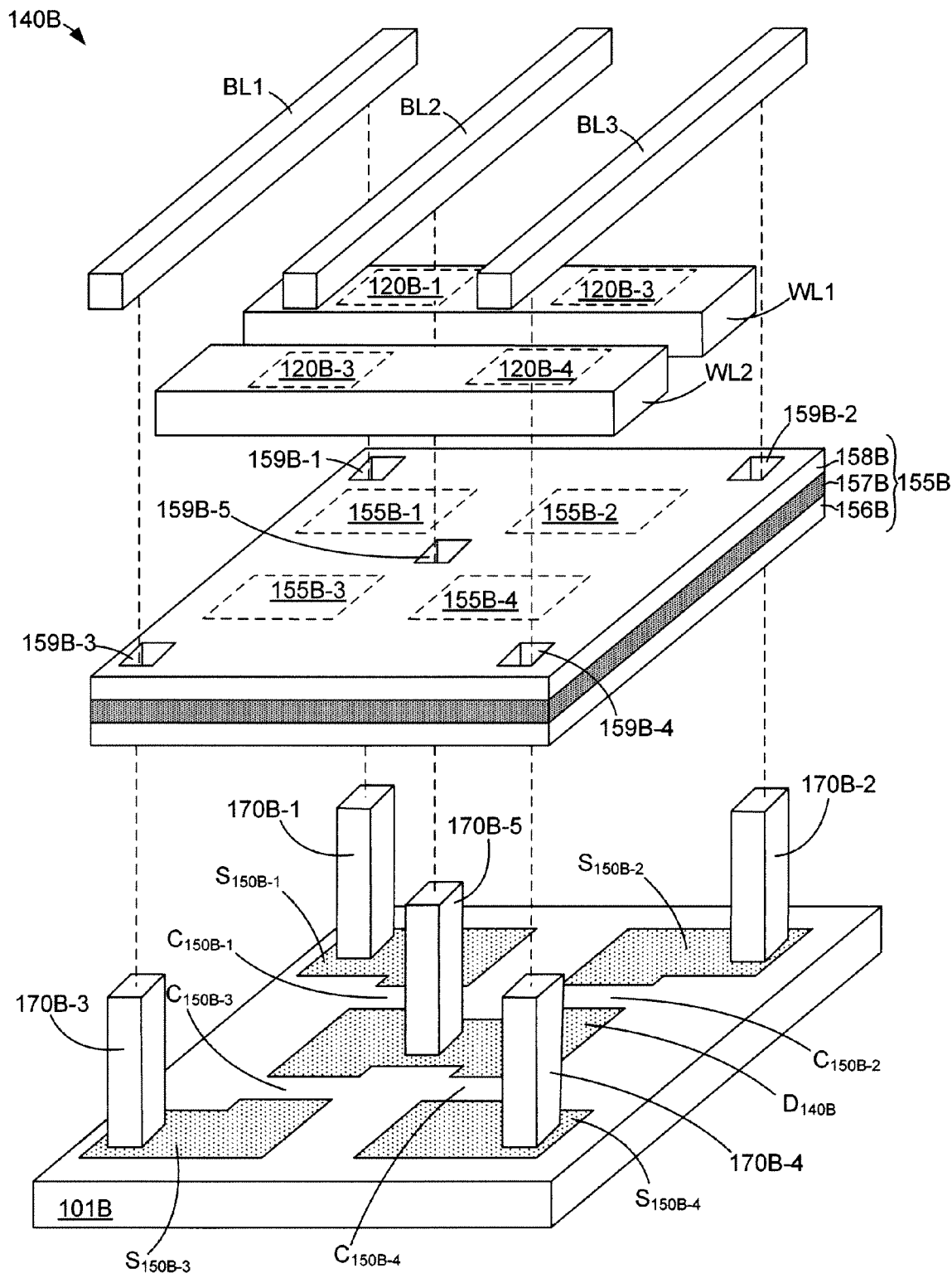
FIGS. 10(A) and 10(B) are simplified exploded and assembled perspective views, respectively, showing the CEONOS cell group of FIG. 9 in additional detail.
Figure 10B:
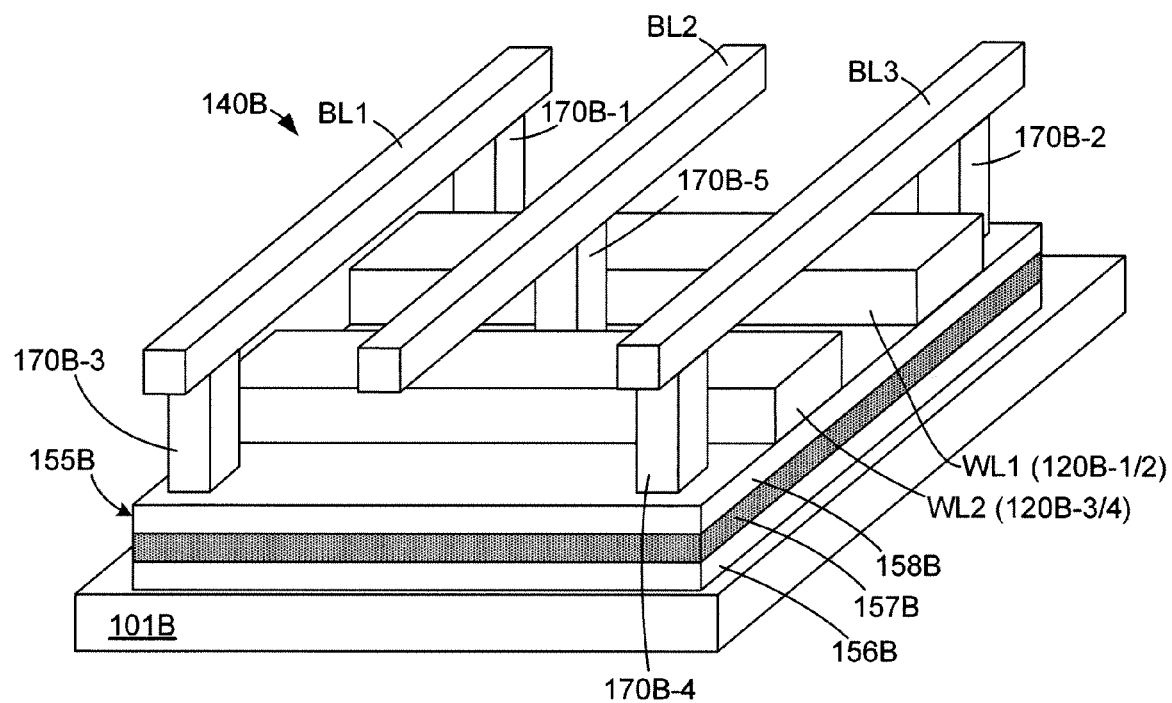

FIGS. 9, 10(A) and 10(B) show a CMOS IC 100B including a CEONOS NVM cell group 140B that is formed in accordance to another embodiment of the present invention. Referring to FIG. 9, which is a simplified top plan view, CEONOS NVM cell group 140B includes four CEONOS NVM cells 150B-1, 150B-2, 150B-3 and 150B-4 that are fabricated on a substrate 101B in a manner consistent with the embodiments described above such that the four cells are disposed in an "X-array" pattern around a central "shared" drain (diffusion) region $D_{140B}$, with cells 150B-1 and 150B-2 aligned horizontally to form an upper row of the group above shared drain region $D_{140B}$, and cells 150B-1 and 150B-2 aligned horizontally to form a lower row of the group below shared drain region $D_{140B}$. In addition cells 150B-1 and 150B-3 are aligned vertically to form a first column on the left side of shared drain region $D_{140B}$, and cells 150B-2 and 150B-4 are aligned to form a second column to the right of shared drain region $D_{140B}$.

As indicated in FIG. 9, each cell 150B-1 to 150B-4 of group 140B is formed by an associated portion of shared drain region $D_{140B}$ and an associated source (diffusion) region. That is, group 140B includes four source (diffusion) regions $S_{150B-1}$, $S_{150B-2}$, $S_{150B-3}$ and $S_{150B-4}$, each respectively associated with one of cells 150B-1 to 150B-4, that are formed by one or more dopant materials diffused into substrate 101 and disposed adjacent to and separated from associated portions $D_{150B-1}$, $D_{150B-2}$, $D_{150B-3}$ and $D_{150B-4}$ of shared drain region $D_{140B}$ by an associated channel region $C_{150B-1}$, $C_{150B-2}$, $C_{150B-3}$ and $C_{150B-4}$. For example, cell 150B-1 is formed by source (diffusion) region $S_{150B-1}$, which is separated from associated portion $D_{1650B-1}$ of shared drain region $D_{140B}$ by associated channel region $C_{150B-1}$. Similarly, cells 150B-2, 150B-3 and 150B-4 are respectively formed by source regions $S_{150B-2}$, $S_{150B-3}$ and $S_{150B-4}$, which are respectively separated from associated portions $D_{150B-2}$, $D_{150B-3}$ and $D_{150B-4}$ of shared drain region $D_{140B}$ by associated channel regions $C_{150B-1}$, $C_{150B-3}$ and $C_{150B-4}$. In a preferred embodiment, each source region $S_{150B-1}$, $S_{150B-2}$, $S_{150B-3}$ and $S_{150B-4}$ and shared drain region $D_{140B}$ include the n-type LDD implant (e.g., As or P diffused in an associated P-well) and p-type pocket implant (i.e., B or $BF_2$ diffused into the associated P-well) formed in the manner described above with reference to FIGS. 3(A) to 3(O).

Similar to the single-cell embodiment described above, each cell 150B-1 to 150B-4 of group 140B includes a polycrystalline silicon gate structure that is disposed over the cell's channel region. In the preferred embodiment, these four gate structures are formed by two elongated polysilicon word line structures WL1 and WL2, which are shown as horizontal dashed-line structures in FIG. 9. These word line structures are formed on an intervening ONO stack (as described below with reference to FIGS. 10(A) and 10(B)), and extend over associated pairs of channel regions to provide gate structures that control the two cells in each row of cells 150B-1 to 150B-4. Specifically, (first) polysilicon word line structure WL1 extends over upper row cells 150B-1 and 150B-2, and includes (first and second) gate portions 120B-1 and 120B-2 that are disposed over channel regions $C_{150B-1}$ and $C_{150B-2}$. Similarly, (second) polysilicon word line structure WL2 extends over lower row cells 150B-3 and 150B-4, and includes (third and fourth) gate portions 120B-3 and 120B-3 that are disposed over channel regions $C_{150B-3}$ and $C_{150B-4}$. Consistent with the description above, each of cells 150B-1 to 150B-4 includes one of these corresponding portions (e.g., cell 150B-1 includes gate portion 120B-1 of word line structure WL1, and cell 150B-4 includes gate portion 120B-4 of word line structure WL2).

As shown in FIG. 9 and FIG. 10(A), each of shared drain region $D_{140B}$ and source regions $S_{150B-1}$, $S_{150B-2}$, $S_{150B-3}$ and $S_{150B-4}$ are operably contacted by metal "via" contacts as follows: metal "via" contact penetrates to the surface of silicon, thus producing electric contact with N+ silicon without silicidation. That is, source regions $S_{150B-1}$, $S_{150B-2}$, $S_{150B-3}$ and $S_{150B-4}$ are respectively contacted by the lower ends of metal contacts 170B-1, 170B-2, 170B-3 and 170B-4, and shared drain region $D_{150B}$ is contacted by the lower end of metal contact 170B-5. These metal contacts are in turn contacted at their upper ends by one of three metal bitlines BL1, BL2 and BL3, which are shown as vertical dashed-line structures in FIG. 9. Specifically, bitline BL1 is connected to source regions $S_{150B-1}$ and $S_{150B-3}$ by way of metal contacts 170B-1 and 170B-3, respectively, bitline BL2 is connected to shared drain region $D_{140B}$ by way of metal contact 170B-5, and bitline BL3 is connected to source regions $S_{150B-2}$ and $S_{150B-4}$ by way of metal contacts 170B-2 and 170B-4, respectively. Note that, as indicated in FIG. 9, metal contacts 170B-1 to 170B-5 generally delineate the "X" shape of group 140B, with metal contact 160B-5 disposed in the center of the "X".

FIGS. 10(A) and 10(B) are exploded and assembled partial perspective views showing features of group 140B in additional detail. Referring to FIG. 10(A), group 140B includes a continuous stack layer 155B having ONO stack portions 155B-1, 155B-2, 155B-3 and 155B-4 that are part of and respectively disposed over the source, drain and channel regions of an associated one of cells 150B-1 to 150B-4. For example, ONO stack portion 155B-1 is an integral section of ONO stack layer 155B that forms part of CEONOS NVM cell 150B-1, and is disposed over source region $S_{150B-1}$, drain region $D_{140B-1}$ and channel region $C_{150B-1}$. Similar to the previous embodiments, ONO stack layer 155B includes a nitride layer 157B sandwiched between a lower oxide layer 156B and an upper oxide layer 158B, and as indicated in FIG. 10(B), lower oxide layer 156B is formed directly on an upper surface of substrate 101B. These figures also show that metal contacts 170B-1, 170B-2, 170B-3, 170B-4 and 170B-5 respectively extend through openings 159B-1, 159B-2, 159B-3, 159B-4 and 159B-5 defined through ONO stack layer 155B such that, as indicated in FIG. 10(B), upper portions of each metal contact extend above the upper surface of ONO stack layer 155B. FIG. 10(B) also shows that polysilicon word line structures WL1 and WL2 are disposed directly on an upper surface of upper oxide layer 157B of ONO stack layer 155B, and that bit line structures BL1 to BL3 are disposed over word line structures WL1 and WL2. That is, although omitted from FIGS. 10(A) and 10(B) for clarity, bit line structures BL1 to BL3 are formed on a pre-metal dielectric layer that covers (extends above) word line structures WL1 (i.e., gate portions 120B-1 and 1203-2) and WL2 (i.e., gate portions 120B-3 and 120B-4) in a manner similar to that of layer 160A (shown in FIG. 4).

The X-array pattern formed by CEONOS NVM cells 150B-1 to 150B-4 of group 140B provides maximum substrate area utilization (i.e., high density) due to the shared drain arrangement, and also provides substantially disturb-free operation due to the connection of only one pair of cells to each drain contact in the word line direction. That is, of the four cells sharing drain region $D_{140B}$, only two cells (e.g., cells 150B-1 and 150B-2) are connected in a first word line direction by word line structure WL1, with the other two cells (e.g., cells 1503-3 and 150B-4) being connected in a second word line direction by word line structure WL2. This arrangement provides substantially disturb-free operation by applying the same voltage (e.g., 5V) to both shared drain region and to the source region of the second (non-read) transistor. For example, referring to FIG. 9, the data bit stored on CEONOS NVM cell 150B-1 is read by applying a suitable read voltage to shared drain region $D_{140B}$ (by way of bitline BL2), generating a suitable gate read voltage on wordline WL1, and by measuring the resulting channel current passed to source region S150B-1 (by way of bitline BL1). Note that the drain current in cell 150B-1 can be affected by the programmed state of cell 150B-2, and the opposite is true when cell 150B-2 is being read. To avoid this problem, when cell 150B-1 is being read, the same voltage (e.g., 5V) is applied to both bitline BL2 and to bitline BL3, thereby preventing current through cell 150B-2 regardless of its programmed/erased state. Similarly, when cell 150B-2 is being read, the same voltage is applied to both bitline BL1 and to bitline BL2, thereby preventing current through cell 150B-1. A similar technique is utilized during programming so that, when selecting a cell to be programmed, the rest of the array cells are electrically independent of the selected cell. This addressing technique is easily implemented using uncomplicated circuitry that does not require a significant amount of chip area.

Figure 11:
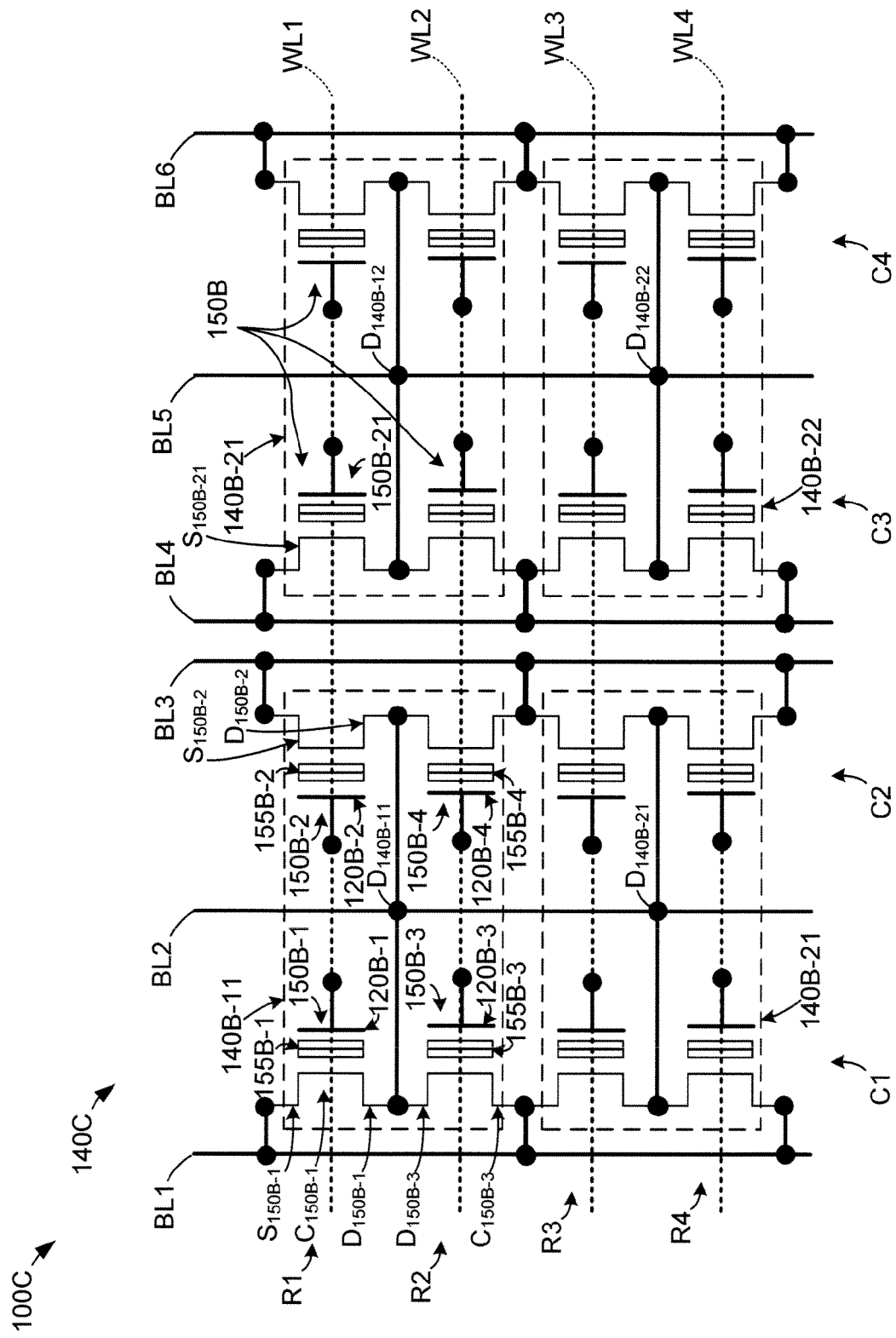
FIG. 11 is a simplified circuit diagram showing an array of CEONOS cell groups connected according to a specific "X-array" architecture embodiment of the present invention.

FIG. 11 is a simplified circuit diagram showing a portion of a CMOS circuit 100C including sixteen CEONOS NVM cells 150B arranged in four rows R1 to R4 and four columns C1 to C4. As in the previous embodiments (e.g., as shown in FIG. 10(B)), CMOS circuit 100C includes an ONO stack layer disposed on the substrate, four polysilicon word line structures WL1 to WL4 disposed on the ONO stack layer, and six bit line structures BL1 to BL6 disposed over and extending perpendicular to word line structures WL1 to WL4. In addition, each of the sixteen CEONOS NVM cells 150B includes source and drain regions separated by a channel region, a non-volatile storage element formed by a portion of the ONO stack layer that is disposed over the source, drain and channel regions, and a gate structure formed by a portion of an associated word line structure WL1 to WL4 that is disposed over the cell's non-volatile storage element. For example, referring to the top left corner of FIG. 11, CEONOS NVM cell 150B-1 includes source region $S_{150B-1}$ and drain region $D_{150B-1}$ separated by channel region $C_{150B-1}$, non-volatile storage element 155B-1, and a gate structure 120B-1 formed by a portion of word line structure WL1. The gate of each CEONOS NVM cell 150B is controlled by a voltage applied to its associated polysilicon word line structure, and the source and drain regions of each CEONOS NVM cell 150B are respectively connected to associated bit line structures by contact structures that between the substrate and the associated bit line structures through the ONO stack layer in the manner described above with reference to FIGS. 10(A) and 10(B). For example, CEONOS NVM cells 150B-1 is controlled by a voltage applied to word line structure WL1 (which controls gate structure 120B-1), and by signals transmitted on bit line structures BL1 and BL2, which are respectively connected to source region $S_{150B-1}$ and drain region $D_{150B-1}$. In this way, the sixteen CEONOS NVM cells 150B are controllable by way of word lines WL1 to WL4 and bit lines BL1 to BL6.

According to an aspect of the embodiment shown in FIG. 11, the sixteen CEONOS NVM cells 150B are arranged into four cell groups 140B-11, 140B-12, 140B-21 and 140B-22. Each of these four groups includes four CEONOS NVM cells disposed in a square pattern occupying two rows and two columns. For example, cell group 140B-11 includes (first and second) CEONOS cells 150B-1 and 150B-2 that are disposed in (first) row R1, and (third and fourth) CEONOS cells 150B-3 and 150B-4 disposed in (second) row R2, with (first and third) CEONOS cells 150B-1 and 150B-3 disposed in (first) column C1 and (second and fourth) CEONOS cells 150B-2 and 150B-4 disposed in (second) C2. Similarly, cell group 140B-12 includes CEONOS NVM cells that are disposed in rows R1 and R2, and columns C3 and C4, cell group 140B-21 includes CEONOS NVM cells that are disposed in rows R3 and R4, and columns C1 and C2, and cell group 140B-22 includes CEONOS NVM cells that are disposed in rows R3 and R4, and columns C3 and C4.

Each of the four cell groups 140B-1 to 140B-4 is also configured in a manner consistent with the arrangement described above with reference to FIGS. 9, 10(A) and 10(B), with each cell group including a centrally-located shared drain region formed by diffused dopants such that it is located between that group's associated rows and columns, with each cell's source region being separated from the shared drain region by an associated channel region. For example, cell group 140B-11 includes a shared drain region $D_{140B-11}$ disposed between (first and second) rows R1 and R2, and between (first and second) columns C1 and C2, and includes four portions that form drain regions $D_{150B-1}$ to $D_{150B-4}$ of CEONOS NVM cells 150B-1 to 150B-4, where drain region $D_{150B-1}$ of cell 150B-1 is separated from source region $S_{150B-1}$ by channel region $C_{150B-1}$, drain region $D_{150B-2}$ of cell 150B-2 is separated from source region $S_{150B-2}$ by channel region $C_{150B-2}$, drain region $D_{150B-3}$ of cell 150B-3 is separated from source region $S_{150B-3}$ by channel region $C_{150B-3}$, and drain region $D_{150B-4}$ of cell 150B-4 is separated from source region $S_{150B-4}$ by channel region $C_{150B-4}$. Similarly, cell group 140B-12 includes a shared drain region $D_{140B-12}$ disposed between rows R1/R2 and columns C3/C4, cell group 140B-21 includes a shared drain region $D_{140B-21}$ disposed between rows R3/R4 and columns C1/C2, and cell group 140B-22 includes a shared drain region $D_{140B-22}$ disposed between rows R3R4 and columns C3/C4.

According to another aspect, the cell groups are arranged in a square pattern such that groups occupying each adjacent pair of rows share two word line structures, and such that cell groups occupying each adjacent pair of columns share three bit line structures. That is, the CEONOS NVM cells of cell groups 140B-11 and 140B-12 occupy rows R1 and R2 and share word line structures WL1 and WL2, and the CEONOS NVM cells of cell groups 140B-21 and 140B-22 occupy rows R3 and R4 and share word line structures WL3 and WL4. Likewise, the CEONOS NVM cells of cell groups 140B-11 and 140B-21 occupy columns C1 and C2 and share bit line structures BL1, BL2 and BL3 (e.g., shared drain regions $D_{140B-11}$ and $D_{140B-21}$ are connected to bit line BL2), and the CEONOS NVM cells of cell groups 140B-12 and 140B-22 occupy columns C3 and C4 and share bit line structures BL4, BL5 and BL6. The distinguishing feature of the X-array is its simplicity, high density and immunity to disturb effects.

In an alternative embodiment, neighboring cell groups cell groups 140B-11 and 140B-12 could share a bit line structure (e.g., bit line structures BL3 and BL4 could be implemented by a single "shared" bit line structure, and both source region $S_{150B-2}$ of cell 150B-2 in cell group 140B-11 and source region $S_{150B-21}$ of cell 150B-21 in cell group 140B-21 could be connected to the "shared" bit line structure). However, although this shared signal line arrangement could reduce average cell size, but would require more complicated control circuitry.

Figure 12:
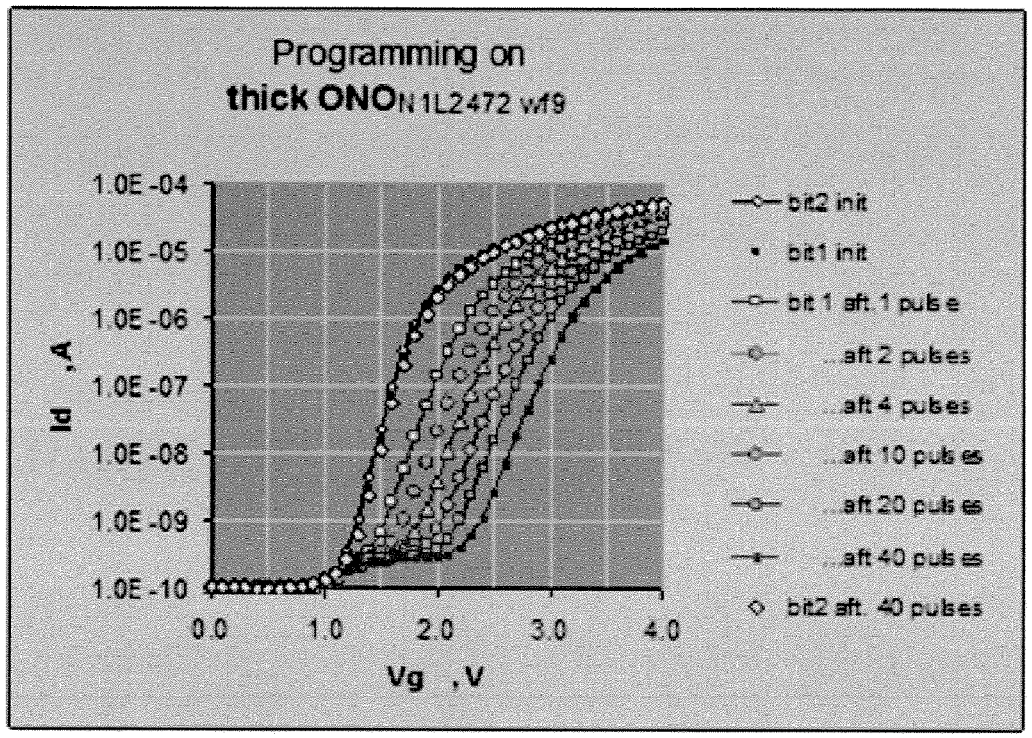
FIG. 12 is a graph showing experimental cell programming test data generated for CEONOS NVM cells indicating read drain current/voltage characteristics for various programming conditions.
Figure 13:
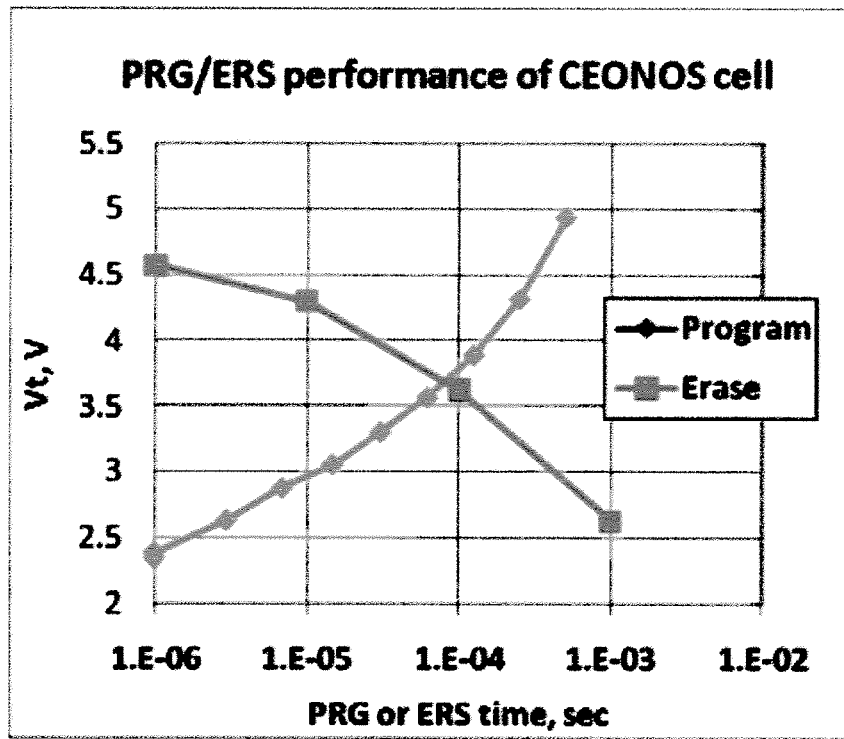
FIG. 13 is a graph showing cell programming test data generated for CEONOS NVM cells for various program/erase times using selected programming voltages.
Figure 14:
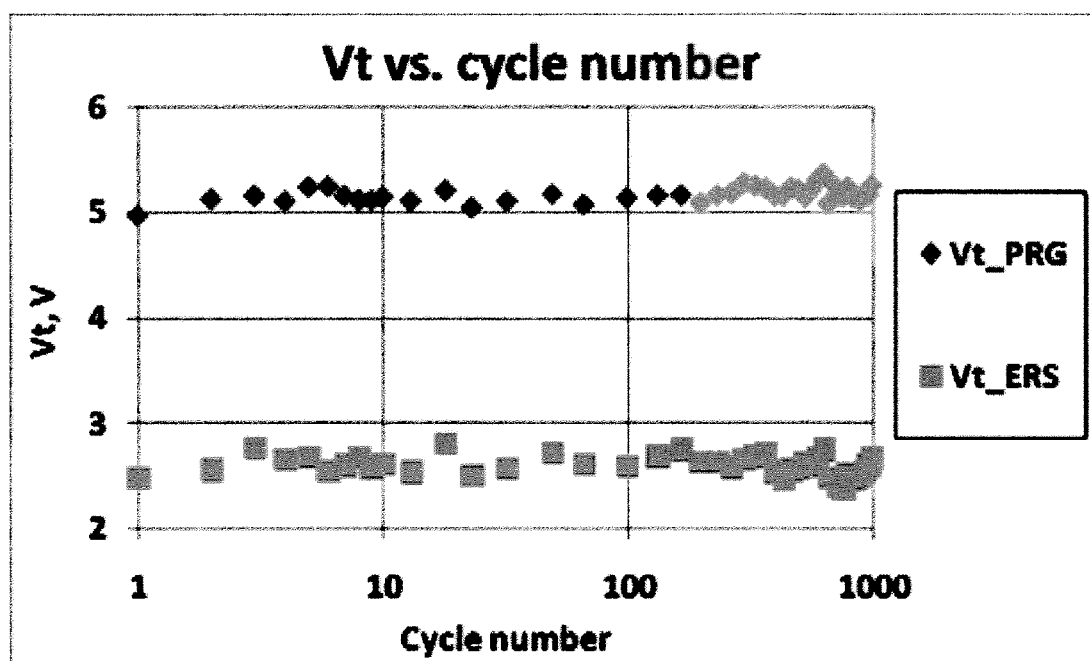
FIG. 14 is a graph showing experimental data associated with cell program/erase cycling data generated for CEONOS NVM cells showing voltage levels in the programmed and erased state.

FIGS. 12-14 include graphs showing experimentally generated data measured from prototype CEONOS NVM cells (on silicon) fabricated at the single cell and mini-array level.

FIG. 12 is a graph showing experimental cell programming test data generated for CEONOS NVM cells indicating drain current/gate voltage characteristics for various programming times (i.e., number of pulses). The parallel shifts of Id(Vg) curves show absence of degradation.

In accordance with another embodiment of the present invention, program/erase operations are implemented using a channel hot electron (CI-IE) regime in which positive voltage pulses are applied to the drain and gate (i.e., in contrast to the pulses utilized by the PAISHEI approach). In one specific embodiment, programming of CEONOS NVM cells was performed using drain (Vd) and gate (Vg) voltages of 5.5V to 6V (i.e., Vd=Vd), and erasing was performed using Vd=5V and Vg=-5V. FIG. 13 is a graph showing cell programming test data generated for CEONOS NVM cells for various program/erase times using these programming voltages.

FIG. 14 is a graph showing cell program/erase cycling data generated for CEONOS NVM cells showing voltage levels in the programmed and erased state. This graph indicates that the test cells retained nearly identical programmed and erased voltage levels over several hundred program/erase cycles.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with reference to NMOS-type NVM cells, those skilled in the art will recognize that the concepts described above may be utilized to produce OTP PMOS-type cells programmed by band-to-band tunneling of electrons from the drain region (5V at gate and -5V at drain of a p-channel CEONOS cell).

The invention claimed is:

1. A CMOS integrated circuit (IC) comprising:
a semiconductor substrate:
a cost-efficient SONOS (CEONOS) non-volatile memory (NVM) cell including:
a source region and a drain region formed by dopant materials diffused into the substrate and spaced apart such that the source and drain regions are separated by a channel region,
a polycrystalline silicon (polysilicon) gate structure disposed over the channel region, and
an oxide-nitride-oxide (ONO) stack disposed between the substrate and the polysilicon gate structure and extending over the source and drain regions, said ONO stack including a nitride layer that is separated from the substrate by a first oxide layer and is separated from the polysilicon gate structure by a second oxide layer; and
means disposed on the substrate for applying respective programming voltages to the source and drain regions and to the polysilicon gate structure such that channel hot electrons are generated in the channel region that become trapped in a portion of the nitride layer located over the channel region,
wherein the source region and the drain region respectively include first and second lightly-doped drain extension diffusion (LDD) implants comprising an n-type dopant material diffused into the substrate such that the channel region is disposed between first and second inside LDD boundaries of said first and second LDD implants, and
wherein the source region and the drain region further respectively include first and second pocket implants comprising a p-type dopant material diffused into the substrate such that respective portions of said first and second pocket implants extend from said first and second inside LDD boundaries into said channel region.

2. The CMOS IC of claim 1, wherein the polysilicon gate structure includes a first side edge that is substantially aligned with the first inside LDD boundary of said first LDD implant, and a second side edge that is substantially aligned with the second inside LDD boundary of said second LDD implant.

3. The CMOS IC of claim 1,
wherein the first oxide layer of the ONO stack is formed directly on an upper surface of the substrate, and
wherein the polysilicon gate structure is formed directly on an upper surface of the second oxide layer.

4. The CMOS IC of claim 1,
further comprising a p-type well region formed in the substrate,
wherein the LDD implants of the source region and the drain region comprise one or more of Arsenic and Phosphorous diffused into the p-type well region, and
where the pocket implants of the source region and the drain region comprise one or more of Boron and Boron-difluoride diffused into the p-type well region.

5. A CMOS integrated circuit (IC) comprising:
a semiconductor substrate:
a cost-efficient SONOS (CEONOS) non-volatile memory (NVM) cell including:
a source region and a drain region formed by dopant materials diffused into the substrate and spaced apart such that the source and drain regions are separated by a channel region,
a polycrystalline silicon (polysilicon) gate structure disposed over the channel region, and
an oxide-nitride-oxide (ONO) stack disposed between the substrate and the polysilicon gate structure and extending over the source and drain regions, said ONO stack including a nitride layer that is separated from the substrate by a first oxide layer and is separated from the polysilicon gate structure by a second oxide layer; and
means disposed on the substrate for applying respective programming voltages to the source and drain regions and to the polysilicon gate structure such that channel hot electrons are generated in the channel region that become trapped in a portion of the nitride layer located over the channel region, further comprising:
a first metal contact structure extending through the ONO stack between the source region and a first bit line structure; and
a second metal contact structure extending through the ONO stack between the drain region and a second bit line structure.

6. A CMOS integrated circuit (IC) comprising:
a semiconductor substrate:
a cost-efficient SONOS (CEONOS) non-volatile memory (NVM) cell including:
   a source region and a drain region formed by dopant materials diffused into the substrate and spaced apart such that the source and drain regions are separated by a channel region,
   a polycrystalline silicon (polysilicon) gate structure disposed over the channel region, and
   an oxide-nitride-oxide (ONO) stack disposed between the substrate and the polysilicon gate structure and extending over the source and drain regions, said ONO stack including a nitride layer that is separated from the substrate by a first oxide layer and is separated from the polysilicon gate structure by a second oxide layer; and
means disposed on the substrate for applying respective programming voltages to the source and drain regions and to the polysilicon gate structure such that channel hot electrons are generated in the channel region that become trapped in a portion of the nitride layer located over the channel region,
wherein said means for applying said respective programming voltages to the source and drain regions and to the polysilicon gate structure comprises means for generating a sequence of negative and positive programming pulse signals in one of the source region and the drain region, disconnecting the other of the source region and the drain region, and applying a positive programming pulse on the polysilicon gate structure, said negative and positive programming pulses being generated such that electrons are heated in the channel region both by the gate voltage and by a lateral field generated between the source region and the drain region, whereby at least some of the heated electrons are trapped by said portion of the nitride layer.

7. The CMOS circuit according to claim 6, wherein said means for applying said respective programming voltages comprises means for generating said positive programming pulses at a nominal value of approximately 5V, and generating said negative programming pulses in the range of −0.5 and −1V.

8. The CMOS circuit according to claim 6, wherein said means for applying said respective programming voltages comprises means for generating a first negative programming pulse of said plurality of negative programming pulses for a period of 1 μs, and means for generating first positive programming pulses of said plurality of positive programming pulses for a period of 5 μs immediately after said first negative programming pulse.

9. The CMOS circuit according to claim 6, wherein said means for applying said respective programming voltages comprises means for generating a second negative programming pulse of said plurality of negative programming pulses immediately after said first positive programming pulses, and means for generating second positive programming pulses of said plurality of positive programming pulses immediately after said second negative programming pulse.

* * * * *